(12) United States Patent
Tan et al.

(10) Patent No.: US 9,626,024 B1
(45) Date of Patent: Apr. 18, 2017

(54) COMPOSITE COVER ASSEMBLY FOR ELECTRONIC DEVICES

(71) Applicant: Amazon Technologies, Inc., Reno, NV (US)

(72) Inventors: Hung-Bing Tan, San Jose, CA (US); David Eric Peters, San Jose, CA (US); Shan Cheng, Los Altos, CA (US); Shankar Ganapathysubramanian, Cupertino, CA (US)

(73) Assignee: Amazon Technologies, Inc., Seattle, WA (US)

( * ) Notice: Subject to any disclaimer, the term of this patent is extended or adjusted under 35 U.S.C. 154(b) by 154 days.

(21) Appl. No.: 14/223,414

(22) Filed: Mar. 24, 2014

(51) Int. Cl.
*G02F 1/1335* (2006.01)
*G06F 3/041* (2006.01)
*H05K 13/00* (2006.01)

(52) U.S. Cl.
CPC .......... *G06F 3/0412* (2013.01); *H05K 13/00* (2013.01)

(58) Field of Classification Search
CPC ..... G02F 1/13338; G02F 2001/133616; G06F 3/0412; H05K 13/00
USPC ......................................................... 349/12
See application file for complete search history.

(56) References Cited

U.S. PATENT DOCUMENTS 8,995,807 B1 * 3/2015 Jalava ...................... G02B 6/34
385/37
2002/0145593 A1 * 10/2002 Boyd .................. G02B 6/0023
345/173
2007/0139299 A1 * 6/2007 Huang ................ G02F 1/13452
345/3.1
2015/0197634 A1 * 7/2015 O'Brien .................. C08L 77/00
428/221

FOREIGN PATENT DOCUMENTS

CA 2678099 10/2012
EP 212332 7/2010

OTHER PUBLICATIONS

Bob Yirka, "DNP Unveils New Plastic Cover Sheet for Handheld Devices", Dec. 5, 2012, http:phys.org/news/2012-12-dnp-unveils-plastic-sheet-handheld.htm, 2 pgs.
PPG Aerospace Transparencies, Cockpit Windows, Boeing 747-100/200/300/400, Transparency Bulletin Spring 2010, Copyright PPG Industries 2010, 2 pgs.
PPG Aerospace Transparencies, Cockpit Windows, Airbus A300/310/330/340, Transparency Bulletin Fall 2005, Copyright PPG Industries 2005, 2 pgs.
Scratch Resistance Diamond Guard Hard-Coat Resin Technology, Diamond Guard Films UniPixel, http:www.unipixel.com/home/products/protective-films-2, 3 pgs.

* cited by examiner

Primary Examiner — Nathanael R Briggs
Assistant Examiner — William Peterson
(74) Attorney, Agent, or Firm — Lee & Hayes, PLLC

(57) ABSTRACT

Describe herein are electronic devices that includes a display stack having a composite cover component atop a display component. In some instances, the composite cover component includes a top layer and a bottom layer formed from an inorganic material and at least one inner layer formed from an organic material. In other instances, the composite cover component includes a top layer and a bottom layer formed from an organic material and at least one inner layer formed from an inorganic material.

20 Claims, 14 Drawing Sheets

1100

```
┌─────────────────────────────────────────────────────────────┐
│ CONTACT A BOTTOM SURFACE OF A FIRST INNER LAYER OF A COVER  │
│ COMPONENT WITH A TOP SURFACE OF A SECOND INNER LAYER OF THE │
│                    COVER COMPONENT                          │
│                          1102                               │
└─────────────────────────────────────────────────────────────┘
                              ↓
┌─────────────────────────────────────────────────────────────┐
│                  LAMINATE THE INNER LAYERS                  │
│                          1104                               │
└─────────────────────────────────────────────────────────────┘
                              ↓
┌─────────────────────────────────────────────────────────────┐
│ CONTACT A BOTTOM SURFACE OF A TOP LAYER OF THE COVER        │
│ COMPONENT WITH A TOP SURFACE OF THE FIRST INNER LAYER       │
│                          1106                               │
└─────────────────────────────────────────────────────────────┘
                              ↓
┌─────────────────────────────────────────────────────────────┐
│           LAMINATE THE TOP LAYER AND THE INNER LAYERS       │
│                          1108                               │
└─────────────────────────────────────────────────────────────┘
                              ↓
┌─────────────────────────────────────────────────────────────┐
│ CONTACT A TOP SURFACE OF A BOTTOM LAYER OF THE COVER        │
│ COMPONENT WITH A BOTTOM SURFACE OF THE SECOND INNER LAYER   │
│                          1110                               │
└─────────────────────────────────────────────────────────────┘
                              ↓
┌─────────────────────────────────────────────────────────────┐
│   LAMINATE THE BOTTOM LAYER WITH THE INNER LAYERS AND THE   │
│                        TOP LAYER                            │
│                          1112                               │
└─────────────────────────────────────────────────────────────┘
```

```
┌─────────────────────────────────────────────────────────────────┐
│ CONTACT A BOTTOM SURFACE OF A TOP LAYER OF THE COVER COMPONENT  │
│              WITH A TOP SURFACE OF A FIRST INNER LAYER          │
│                              1202                               │
└─────────────────────────────────────────────────────────────────┘
                                 │
                                 ▼
┌─────────────────────────────────────────────────────────────────┐
│ LAMINATE THE TOP LAYER AND THE FIRST INNER LAYER TO FORM A TOP  │
│                   PORTION OF THE COVER COMPONENT                │
│                              1204                               │
└─────────────────────────────────────────────────────────────────┘
                                 │
                                 ▼
┌─────────────────────────────────────────────────────────────────┐
│ CONTACT A TOP SURFACE OF A BOTTOM LAYER OF THE COVER COMPONENT  │
│             WITH A BOTTOM SURFACE OF A SECOND INNER LAYER       │
│                              1206                               │
└─────────────────────────────────────────────────────────────────┘
                                 │
                                 ▼
┌─────────────────────────────────────────────────────────────────┐
│ LAMINATE THE BOTTOM LAYER AND THE SECOND INNER LAYER TO FORM A  │
│                 BOTTOM PORTION OF THE COVER COMPONENT           │
│                              1208                               │
└─────────────────────────────────────────────────────────────────┘
                                 │
                                 ▼
┌─────────────────────────────────────────────────────────────────┐
│ CONTACT A BOTTOM SURFACE OF THE FIRST INNER LAYER WITH A TOP    │
│              SURFACE OF THE SECOND INNER LAYER                  │
│                              1210                               │
└─────────────────────────────────────────────────────────────────┘
                                 │
                                 ▼
┌─────────────────────────────────────────────────────────────────┐
│ LAMINATE THE TOP AND BOTTOM PORTIONS TO FORM THE COVER COMPONENT│
│                              1212                               │
└─────────────────────────────────────────────────────────────────┘
```

Fig. 12

COMPOSITE COVER ASSEMBLY FOR ELECTRONIC DEVICES

BACKGROUND

A large and growing population of users is enjoying entertainment through the consumption of digital content, such as music, movies, images, electronic books, and so on. The users employ various devices with electronic displays such as electronic book ("eBook") readers, cellular telephones, smart phones, portable media players, tablet computers, wearable computers, laptop computers, netbooks, desktop computers, televisions, appliances, home electronics, automotive electronics, augmented reality devices, and so forth to view the digital content. Electronic displays may present various types of information, such as user interfaces, device operational status, digital content items, and the like, depending on the kind and purpose of the associated device. The appearance and quality of a display can affect the user's experience with the electronic device and the content presented thereon. Accordingly, finding ways to enhance user experience and satisfaction continues to be a priority.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items or features.

FIG. 11 illustrates another example flow diagram showing an illustrative process for forming the composite cover component of the display stack of FIGS. 1-5.

FIG. 12 illustrates another example flow diagram showing an illustrative process for forming the composite cover component of the display stack of FIGS. 1-5.

DETAILED DESCRIPTION

Figure 1:
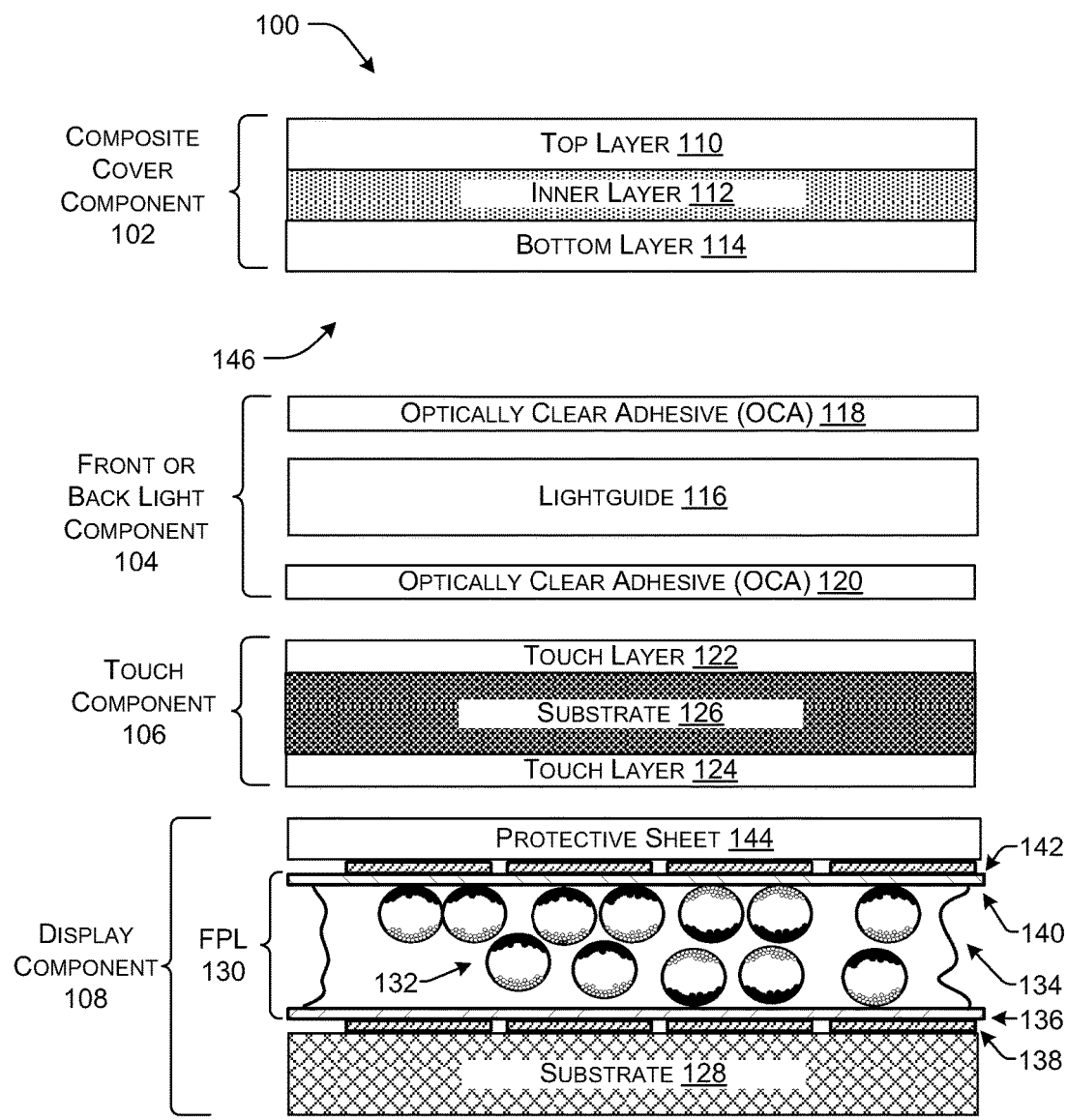
FIG. 1 illustrates an example schematic cross-section of a display stack of an electronic device.

This disclosure describes, in part, electronic devices that include electronic displays for displaying digital content to one or more users. In some particular examples, this disclosure describes ways to provide a thinner, lighter, more impact resistant, and/or cheaper electronic device. For instance, in some implementations, a composite or laminate coverglass or cover component including both inorganic and organic layers may be utilized in lieu of the traditional coverglass structure. By subsisting portions of the glass (e.g., an inorganic material) for a plastic or polymer material (e.g., an organic material), a coverglass component may be manufactured at reduced weight while maintaining sufficient rigidity and hardness. In other instances, a coverglass component may be manufactured with a desired flexibility for use in some types of displays, such as a watch display. Additionally, a cover component formed from composite materials may be manufactured to have improved impact resistance. In various implementations, the plastic or polymer layers may include additives or materials selected with specific optical properties, such as ultra-violate (UV) properties, antireflective properties, antiglare properties, among others.

In general, a display stack has a number of layers, including a number of substrates and one or more adhesive layers to bond the substrates. For example, a display stack may include a display component that displays content. Additionally, a number of additional substrates may be stacked on top of the display component. To illustrate, a display stack may include a touch layer that generates signals in response to an input device contacting the display stack. In some cases, a substrate of the display stack may include a coverglass layer located at the top of the display stack to protect other substrates of the display stack. The display stack may also include a lighting component, such as a front-side lighting component or a backlight lighting component to provide light to view the content displayed by the display component.

In general, a coverglass or cover component may be configured as the outermost layer of the display stack to protect the display from damage, such as scratching, chipping, peeling, as well as to provide rigidity and stiffness to the overall electronic device. Thus, the coverglass or cover component may be configured to run the entire width and height of the electronic device. In general, the coverglass or cover component may have a hardness rating that is resistant to a 3h pencil or greater, while in other cases, the coverglass or cover component may have a hardness rating between 5H pencil and 9H pencil. Typically, the coverglass or cover component may be manufactured to be less than 1 millimeter (mm) thick and, in some implementations, may be in the range of 0.5 mm to 0.7 mm.

In one implementation, the cover component describe herein may be a rigid structure including a top inorganic layer, at least one inner organic layer, and a bottom inorganic layer. In other implementations, the cover component may be a flexible structure including a top organic layer, at least one inner inorganic layer, and a bottom organic layer. In some implementations, the cover component may include inner layers formed from both inorganic and organic materials. In some examples, the inorganic layers may each be formed from material, such as glass, sapphire, or a ceramic aluminum and the organic layers may each be formed from materials, such as polyurethane, polymethylmethacrylate (PMMA), polycarbonate (PC), polyethylene terephthalate (PT), silicone, cycloolefin polymer (COP), cycloolefin copolymer (COC), or a copolymer formed from a combination thereof.

In some examples, one or more of the layers may be formed from optically clear adhesive (OCA), such as an acrylic OCA having specific UV properties or a silicone OCA having a specific refractive index. For example, the acrylic OCA may have a luminous transmittance of 90% or greater above 400 nanometer (nm) wavelengths, 5% or less below 300 nm wavelength, and between 5% and 90% between 300 and 400 nm wavelength. In one particular example, the luminous transmittance of the first type of OCA may be zero percent below 380 nm wavelength and greater than 90% above 400 nm wavelength. In another example, the refractive index for the second OCA may be in a range from about 1.3 to about 1.51. In another example, the refractive index of the second OCA may be in the range of about 1.39 to 1.45. In one particular example, the refractive index of the second OCA may be about 1.41. In some cases, the inner layers may includes plastics, polymers, or glass having additives with antiglare proprieties, UV properties, antireflective properties, among others, while the top layer may include materials or additives having anti-smudging, anti-fingerprinting properties, or anti-cracking properties.

In some specific implementations, the cover component is configured to maintain a thickness of less than 1 mm, while incorporating various other typically associated with other layers of the display stack. For example, the cover component may include a touch layer or pattern laminated between the two outer layers. In another example, the cover component may have inner layers including a lightguide sandwiched between two layers of PMMA. In some implementations, the inorganic layers may be 0.1 mm thick and the inner organic layers may equal between 0.3 mm and 0.8 mm thick. In one specific instance, the organic layers may equal 0.5 mm to 0.8 mm thick. By replacing portions of the coverglass with plastic or polymer layers, the overall weight of the coverglass or cover component may be reduced by up to as 50%.

In an illustrative implementation, the display stack may be formed by combining a number of substrates and/or components one atop the other. For instance, FIGS. 1-7, described below, illustrate example schematic cross-section of a display stack including a number of layers taken along line A-A of FIG. 8.

FIG. 1 illustrates an example schematic cross-section of a display stack 100 of an electronic device. The display stack 100 includes a composite cover component 102, a front or back light component 104, a touch component 106, and a display component 108. In general, the cover component 102 is formed from various layers 110-114 some of which are formed from a transparent organic material, while others are formed from a transparent inorganic material in order to generate a reduced weight cover component 102 having a specific hardness and rigidity. For instance, in the illustrated example, the cover component 102 includes a top layer 110, an inner layer 112, and a bottom layer 114.

In some examples, the top and bottom layers 110 and 114 may be formed from a transparent inorganic material to provide a specific hardness and rigidity, while the inner layer 112 may be formed from a transparent organic material, such as a plastic or polymer material, to produce a cover component 102 with reduced weight. Thus, the cover component 102 may be configured to run the entire width and height of the electronic device. By selecting a transparent inorganic material for the top layer 110 and the bottom layer 114, a cover component 102 may be formed having a specific hardness rating, such as more than 3H pencil. Likewise, by forming the inner layer 112 form an organic material some of the weight typically associated with a glass cover component 102 may be shed, as the density of the organic material (e.g., plastics or polymers) is generally less than the density associated with an inorganic material (e.g., glass).

In other implementations, the cover component 102 may be manufactured for a desired flexibility, for instance, for use in a curved display stack, such as those typically associated with wrist watch displays. In these implementations, the top and bottom layers 110 and 114 may be formed from transparent inorganic materials and the inner layer 112 may be formed from transparent organic materials. Again, by replacing some of the inorganic materials with organic materials the overall weight may be reduced, as the density of the organic materials is much lower than that of the inorganic materials. However, by sandwiching the organic material around the inorganic material cover component 102 may be manufactured having some flexibility but sufficient rigidity to prevent cracking or snapping of the electronic device by an end user.

In some instances, the transparent inorganic materials may be glass, sapphire, a ceramic aluminum or combination thereof and the transparent organic materials may be polyurethane, PMMA, PC, PT, silicone, COP, COC, or a combination thereof. In other instances, different transparent inorganic materials and different transparent organic materials may be used for the different layers 110-114

In some examples, the one or more of the layers 110-114 may include an antiglare layer, antireflective layer, and/or UV layer to provide additional properties, in addition to the weight reduction. For example, the inner layer 110 may be manufactured with additives, such a UV-absorbing agent. In some specific instances, such as when the top layer 110 is an organic material, an outer coating or film may applied that is resistant to scratches caused by objects having a hardness rating less than the predefined threshold. For instance, the outer coating or film may be a polyester material, a polycarbonate material, or a combination material.

In one implementation, the composite cover component 102 may be formed by laminating the various layers (e.g., the top layer 110, the inner layers 112, and the bottom layer 114) together. For example, the different layers 110-114 may be laminated together using techniques, such as vacuum lamination, roll-to-roll lamination, piece by piece lamentation, etc. For instance, in one example, the layers 110-114 may be laminated in a vacuum under a pressure of 50 Pascal (Pa) or less for 20 to 30 seconds. In another instance, the a roll-to-roll lamination process performed at a temperature included in a range of about 15° C. to about 40° C. to combined the layers 110-114. In some implementations, the cover component 104 may be produced by coupling the layers 110-114 and then applying heat and an external force. In some cases, the heat and external force may be applied in an autoclave chamber at pressure included in a range of about 10 Pa to about 300 Pa for 20 to 50 seconds. In one implementation, the cover component 104 may be produced by heating the layers 110-114 at a temperature included in a range of about 25° C. to about 80° C. In another instance, the cover component 104 may be produced by heating the layers 110-114 at a temperature included in a range of about 40° C. to about 60° C.

In other implementations, the layers 110-114 may be laminated using an optically clear adhesives (OCA) (e.g., an adhesive film, gel, or tape) to form the cover component 104. For example, a first layer of OCA placed between layer 110 and 112 and a second layer of OCA place between layer 112 and 114. The OCA layers may be cut to have dimensions that correspond to dimensions of the display stack 100 and the OCA layers may be UV cured. For instance, a first cycle of UV radiation may be applied to the first OCA layer followed by applying a second cycle of UV radiation to the second OCA layer. In additional instances, multiple first cycles of UV radiation (e.g., 2 to 250 seconds of UV expose) may be applied to the first OCA layer followed by multiple second cycles of UV radiation applied to the second OCA layer. In various implementations, a period of time can elapse between applying cycles of UV radiation to the OCA layers, for example, a period of time having a duration included in a range of 2 seconds to 30 seconds can elapse between applying cycles of radiation to the OCA. In one specific example, the OCA may be applied by a roller process at a pressure included in a range of 50 kPa to 250 kPa.

In some implementations, the composite cover component 102 may then be laminated together with the other components 104, 106, and 108 of the display stack 100. In other implementations, the composite cover component 102 may be separated from the other components 104-108 of the display stack 100 by an air gap, generally indicated by 246. For example, by including the air gap 246 within the display stack 100, the overall display stack 100 may become more resistant to shock (e.g., dropping of the electronic device).

In the illustrated example, the front or back light component 104 generally includes a lightguide 116 connected to a light source (not shown). The lightguide 116 as illustrated is surrounded on the top and bottom by a layer of OCA 118 and 120, respectively. The lightguide 116 may include a substrate (not shown) formed from a transparent thermoplastic (such as PMMA), a layer of lacquer and multiple grating elements that function to propagate light from the light source towards the top surface of the display stack 100, thus illuminating the content presented on the display. For example, the lightguide 116 may be formed by applying a layer of lacquer to the substrate to create the grating elements of the lightguide 116, the grating elements may be embossed to the layer of lacquer, and the lightguide 116 may be UV-cured. Alternatively, the substrate of the lightguide 116 and the grating elements may be manufactured as a single element, such as via an injection molding process. In some instances, the UV lacquer is made of a cross-linked, tri-functional polymer material that co-polymerizes to a plastic solid when exposed to a high-intensity UV light source.

In some implementations, the light source may be connected to a flexible printed circuit (FPC) to control the quality and volume of light generated. In some instances, the light source (e.g., one or more LEDs) may connect to the FPC via one of the OCA layers 118 or 120. For example, the FPC may be connected to the light source via a solid strip of Solid OCA (SOCA) or the like. The FPC may also be connected to the lightguide 116 via the OCA. In some instances, the FPC may include a light-diffusing refractive coating (e.g., in the form of a white matte finish), which may help to diffuse and reflect light from the light source and, hence, increase the uniformity of the light across the front of the display screen.

The LEDs selected for inclusion in the light source may have a color that is optimized for the type of display being used. For instance, multiple different color temperature LEDs having particular color ratios there between may be selected to ensure a proper color from the collection of LEDs when lighting the display. Furthermore, the color of the LEDs may be tuned over time to compensate for changes in the lightguide, as well based on other factors, such as the aging of the LEDs, the environment for which the device is indented.

The layers of OCA 118 and 120 above and below the lightguide 116 help maintain the light generated by the light source within the lightguide 116. In general, an OCA, such as a Liquid OCA (LOCA) or SOCA, may be applied by depositing the OCA onto the lightguide 116 and, when the OCA reaches the corners of the display stack 100, the corners may be UV-cured. Thereafter, the OCA on the remaining portion of the lightguide 116 may be UV-cured. In other instance, the LOCA or the SOCA may be formed from an acrylic material and/or, in some instances, from silicone. For instance, the LOCA may comprise Loctite® 5192 and/or MSDS made by Nalax3®. The MSDS comprises UV-curable polyurethane acrylates based a formulation comprising of hexamethylene diacrylate, Urethane acrykate oligomer, Acyrlate ester and photoinitator. This formulation may achieve balanced coating properties such as tensile properties, hardness, weather ability, and adhesion. The LOCA may be created by applying the formulation to PMMA rolls using a wet coating method immediately followed by embossing and UV curing (e.g., using a Fusion lamp). In addition, to the OCA layers 118 and 120 a white tape or other type of light-diffusing refractive coating may be laid along a perimeter of the lightguide 116, which again may help to diffuse light from the light source and increase the uniformity of the light from the light source.

In general, a touch sensor or touch component 106 includes one or more touch layers 122 and 124 (e.g., rows and/or columns that form a grid or diamond shape) applied to one or more surfaces of a substrate 126 coupled to a touch controller (not shown). For instance, in the illustrated example, the touch layer 122 (e.g., the rows) is applied to the top surface of the substrate 126 and the touch layer 124 (e.g., the columns) is applied to the bottom surface of the substrate 126 or vice versa. In some particular implementations, the touch component 106 may includes a single touch layer or a single layer multi-touch pattern (e.g., both the rows and columns) applied to one side of the substrate 126.

The touch layers 122 and 124 may include traces made from ITO, copper, printed ink, metal mesh technologies, sliver nanowires, carbon nanotubes, or the like. For example, the touch layers 122 and 124 may be formed by depositing traces of ITO may onto the surfaces of the substrate 126, printing a conductive ink on the surfaces of the substrate 126, or adhering or laminating a pre-formed metal mesh technology or wiring (e.g., sliver nanowires or carbon nanotubes) to the surfaces of the substrate 126. In some specific implementations, traces of ITO may be deposited or patterned onto the surfaces of the substrate 126, for example, using physical vapor deposition, electron beam evaporation, or sputter deposition techniques, among others.

In some implementations, to protect the touch layers 122 and 124 additional dielectric materials may be incorporated into the cover component 102 above the touch component 106. For example, an acrylic material having desired UV properties may be used to form the inner layer 112 of the cover component 102. Additionally the acrylic may be a color acrylic tuned to ensure that a resulting color of the display stack 100 viewed by a user is correct.

In the illustrated example, the touch component 106 resides atop the display component 108. As illustrated, the display component 102 is a reflective display that includes the substrate 128, and a FPL 130, which serves as the image-displaying component. In this example, the FPL 130 includes capsules, generally indicated by 132, as well as a fluid, generally indicated by 134, in which the capsules 132 are suspended. In addition, the FPL 130 includes a lower plastic film 136 onto which the fluid 134 and capsules 132 are deposited, such as using a roll-to-roll process. A grid or pattern of lower electrodes 138 is associated with the lower plastic film 236. Similarly, an upper transparent plastic film 140 may be located on the upper side of the fluid 134 for containing the fluid 134 and the capsules 132.

A grid or pattern of transparent upper electrodes 142 may be formed on or otherwise associated with the upper film 140. In some examples, the upper electrodes 142 may be formed from ITO or other suitable transparent conductive material. As one example, aligned pairs of the upper and lower electrodes 142 and 138, respectively, may each form a single pixel of the display stack 100. For instance, each capsule 132 may include dark and light particles inside the capsule 132. A positive charge on an electrode pair may cause a first color of particle to rise toward the upper plastic film 140 while a negative charge on an electrode pair may cause a second color of particle to rise toward the plastic film 140. A display controller (not shown) may control the charge applied to each electrode pair. Furthermore, in some examples, the pixels (i.e., electrode pairs) may be controlled by applying a sequence of voltages to each pixel, instead of just a single value as in a typical LCD. These sequences of voltages may be referred to as "waveforms," and may be employed to prevent over-charging of the capsules 132, prevent damage to the capsules 132, and so forth.

FIG. 1 illustrates an example schematic cross-section of the display stack 100 with a composite cover component 102 having three individual layers 110-114. However, in other examples, such as the example illustrated below in FIG. 2, the composite cover component 102 may include a top layer 210, a bottom layer 114, and any number of inner layers 112. In some implementations, the thickness of individual layers or the number of inner layers may be constrained, such that the cover component 102 maintains a thickness of less than 1 mm.

Figure 2:
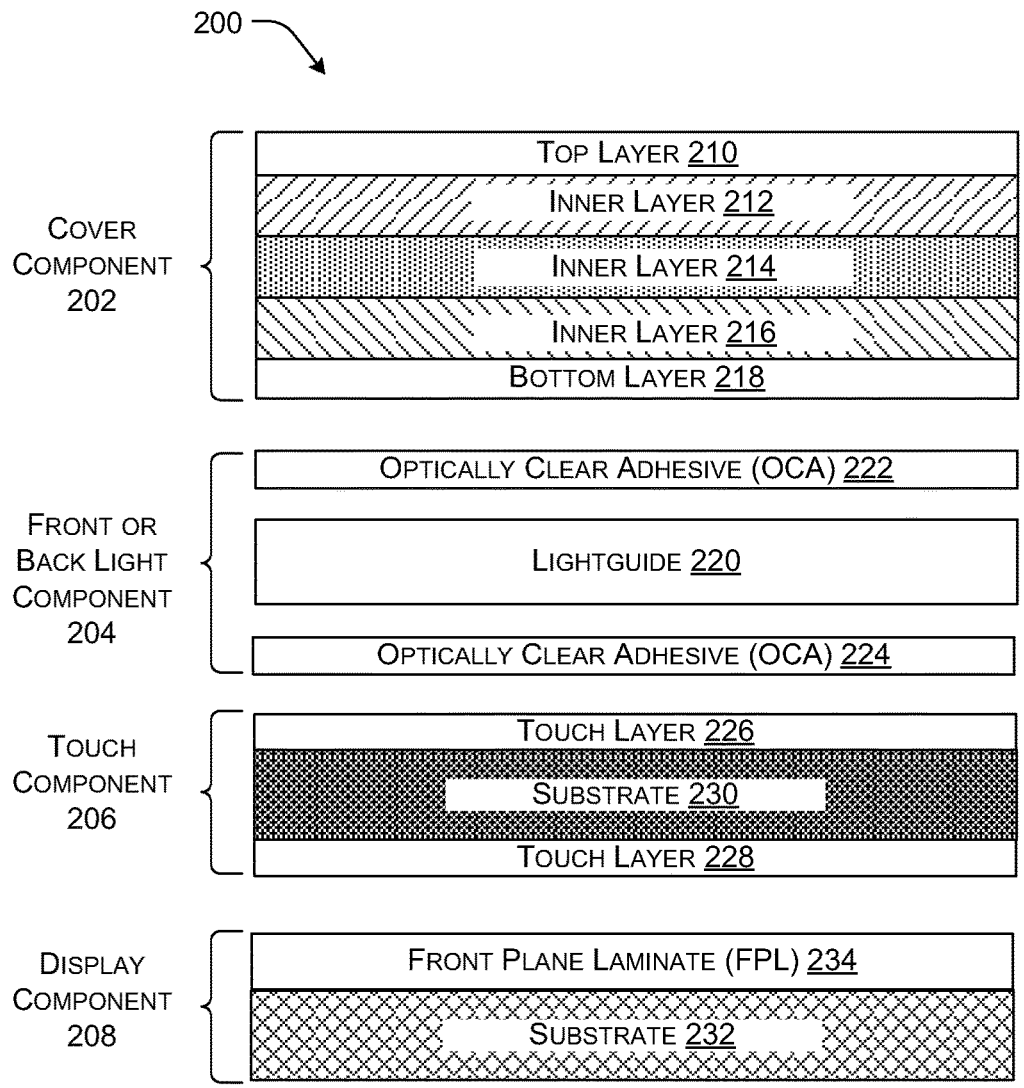
FIG. 2 illustrates an example schematic cross-section of a display stack of an electronic device.

FIG. 2 illustrates an example schematic cross-section of a display stack 200 of an electronic device. The display stack 200 includes a composite cover component 202, a front or back light component 204, a touch layer 206, and a display component 208. In general, the cover component 202 is formed from various layers 210-218 some of which are formed from a transparent organic material, while others are formed from a transparent inorganic material. For instance, in the illustrated example, the cover component 202 includes a top layer 210, three inner layers 212-216, and a bottom layer 218.

In some implementations, the top and bottom layers 210 and 218 may be formed from a transparent inorganic material to provide a specific hardness and rigidity. For instance, the cover component 202 may be configured to protect the display stack 200 from damage, such as scratching, chipping, peeling, as well as to provide rigidity and stiffness to the overall electronic device. By selecting a transparent inorganic material for the top layer 310 and the bottom layer 218, a cover component 202 may be formed having a specific hardness threshold or rating, such as more than 3H pencil. In this implementation, the inner layers 212-216 may be formed from a transparent organic material. By forming the inner layers 212-216 form an organic material some of the weight typically associated with a completely glass cover component 202 may be shed, as the density of the organic material (e.g., plastics or polymers) is generally less than the density associated with an inorganic material (e.g., glass).

In some examples, the one or more of the layers 212-216 may include a material having antiglare properties, antireflective properties, and UV properties. For example, one or more of the inner layers 212-216 may be a silicone material (e.g., a silicone OCA) having desired refractive indexes or one or more inner layers 212-216 may be formed from an acrylic material (e.g., an acrylic OCA) having specific UV reflecting properties. In other examples, one or more of the inner layers 212-216 may include a material tuned to ensure that a resulting color of the display stack 200 viewed by a user is correct or be manufactured with additives such a UV-absorbing agent. In some specific implementations, as will be discussed in more detail below with respect to FIGS. 5 and 6, the inner layers 212-216 may include various other layers of the display stack 200, such as the light component 204 or the touch component 206.

In another implementation, the cover component 202 may be manufactured for a desired flexibility. In this implementation, the top and bottom layers 210 and 218 may be formed from transparent inorganic materials and the inner layers 212-216 may be formed from transparent organic materials. Again, by replacing some of the inorganic materials with organic materials the overall weight may be reduced. However, by locating the organic materials between the inorganic material, cover component 202 may be manufactured having some flexibility but sufficient rigidity to prevent cracking or snapping of the electronic device by an end user.

In the illustrated example, the front or back light component 204 generally includes a lightguide 220 connected to a light source (not shown). The lightguide 220 as illustrated is surrounded on the top and bottom by a layer of OCA 222 and 224. The lightguide 220 may include a substrate (not shown) formed from a transparent thermoplastic (such as PMMA), a layer of lacquer and multiple grating elements that function to propagate light from the light source towards the top surface of the display stack 200, thus illuminating the content presented on the display.

In some implementations, the light source may be connected to a FPC to control the quality and volume of light generated. In some instances, the light source (e.g., one or more LEDs) may connect to the FPC via one of the OCA layers 222 or 224. For example, the FPC may be connected to the light source via a solid strip of SOCA or the like. The FPC may also be connected to the lightguide 220 via the OCA. In some instances, the FPC may include a light-diffusing refractive coating (e.g., in the form of a white matte finish), which may help to diffuse and reflect light from the light source and, hence, increase the uniformity of the light across the front of the display screen.

The layers of OCA 222 and 224 are positioned above and below the lightguide 220 to aid in maintaining the light generated by the light source within the lightguide 220. The LOCA or the SOCA may be formed from an acrylic material and/or, in some instances, from silicone. For instance, the LOCA may comprise Loctite® 5192 and/or MSDS made by Nalax3®. The MSDS comprises UV-curable polyurethane acrylates based a formulation comprising of hexamethylene diacrylate, Urethane acrykate oligomer, Acyrlate ester and photoinitator. This formulation may achieve balanced coating properties such as tensile properties, hardness, weather ability, and adhesion.

In general, a touch sensor or touch component 206 includes one or more touch layers 226 and 228 (e.g., rows and/or columns that form a grid or diamond shape) applied to one or more surfaces of a substrate 230 coupled to a touch controller (not shown). For instance, in the illustrated example, the touch layer 226 (e.g., the rows) is applied to the top surface of the substrate 230 and the touch layer 228 (e.g., the columns) is applied to the bottom surface of the substrate 230 or vice versa. In some particular implementations, the touch component 206 may includes a single layer multi-touch pattern (e.g., both the rows and columns) applied to a single side of the substrate 230.

In the illustrated example, the touch component 206 resides atop the display component 208, which includes a substrate 232 and a FPL 234. In some instances, the FPL 234 includes e-ink capsules, as well as the fluid in which the capsules move up or down in as described above with reference to electronic-paper displays. In some examples, the FPL 234 may include a plastic film structure onto which the e-ink is coated using a roll-to-roll process. Thereafter, a conductive transparent electrode plastic film may be combined with an adhesive layer and a release sheet to form one implementation of the FPL 234.

Figure 3:
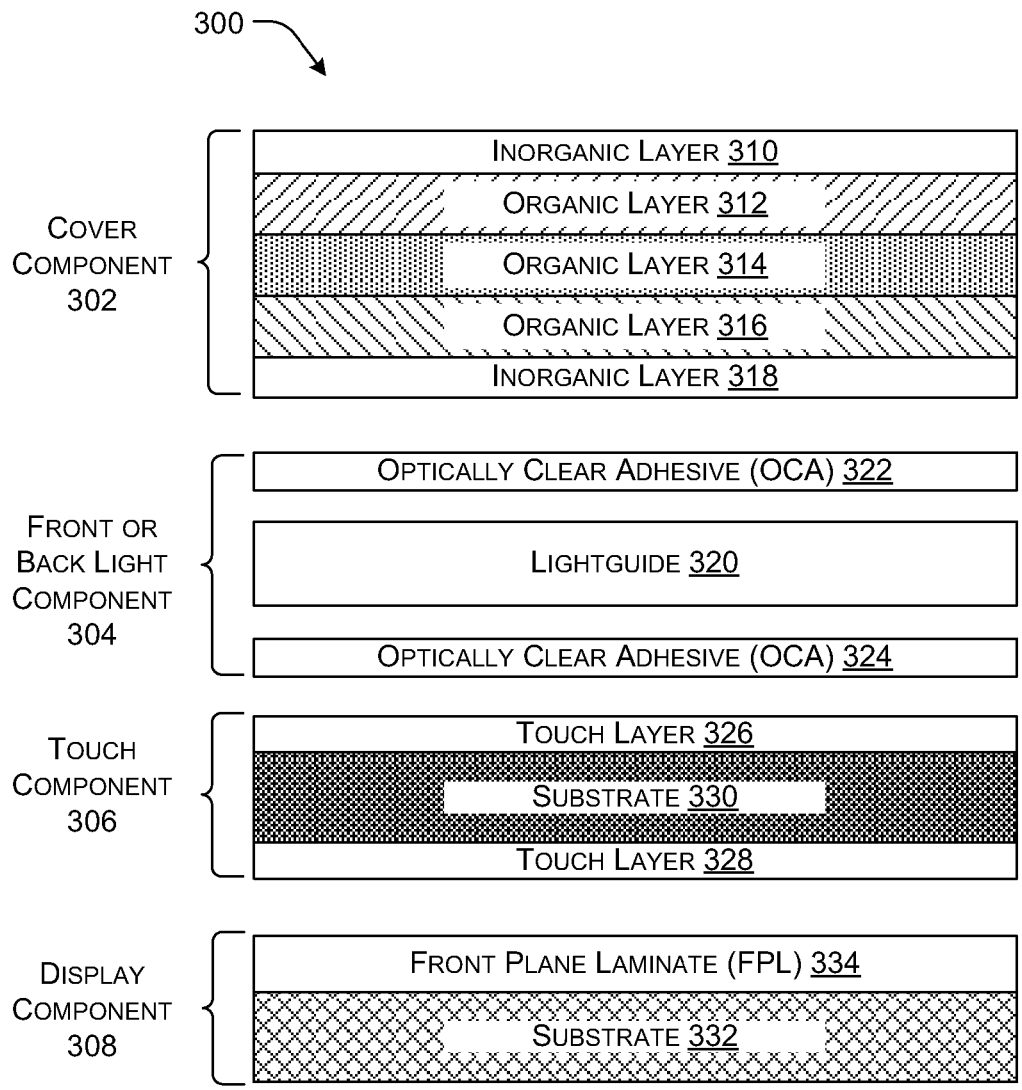
FIG. 3 illustrates an example schematic cross-section of a display stack of an electronic device.

FIG. 3 illustrates an example schematic cross-section of a display stack 300 of an electronic device. The display stack 300 includes a composite cover component 302, a front or back light component 304, a touch layer 306, and a display component 308. In general, the cover component 302 is formed from outer layers 310 and 318 formed from a transparent inorganic material and inner layers 312-316 formed from a transparent organic materials. In the illustrated example, the cover component 302 is a reduced weight cover component 302 having a specific hardness and rigidity, such as a hardness rating between 5H and 9H pencil.

In the illustrated implementations, the cover component 302 may be configured to protect the display stack 300 from damage, such as scratching, chipping, peeling, as well as to provide rigidity and stiffness to the overall electronic device. By forming the top layer 310 and the bottom layer 318 from the inorganic materials, the cover component 302 may be manufactured with specific hardness rating. Likewise, by forming the inner layers 312-316 form an organic material some of the weight typically associated with a completely glass cover component 302 may be shed, as the density of the organic material (e.g., plastics or polymers) is generally less than the density associated with an inorganic material (e.g., glass). It some examples, the thickness of the outer and organic layers 312-316 may be varied to achieve the desired hardness and rigidity. For instance, in one implementation, the inorganic layers 310 and 318 may be 0.1 mm thick and the inner organic layers may equal between 0.3 mm and 0.8 mm thick. Thus in a 1 mm display stack 300, by replacing up to 80% of the inorganic material with organic inner layers 312-316 the cover component may realize weight reductions by up to 50% when compared to an entirely inorganic coverglass.

In some examples, the one or more of the organic layers 312-316 may include a material having antiglare properties, antireflective properties, and UV properties. For example, one or more of the organic layers 312-316 may be a silicone material (e.g., a silicone OCA) having desired refractive indexes or one or more inner layers 312-316 may be formed from an acrylic material (e.g., an acrylic OCA) having specific UV reflecting properties. In other examples, one or more of the inner layers 312-316 may include a material tuned to ensure that a resulting color of the display stack 300 viewed by a user is correct or be manufactured with additives such a UV-absorbing agent. In some instances, the organic layers may be a polyurethane, PMMA, PC, PT, silicone, COP, COC, or combination thereof. In some specific instances, different transparent inorganic materials may be selected for each of the layers 312, 314, and 316, for example, to provide different properties.

In the illustrated example, the front or back light component 304 generally includes a lightguide 320 connected to a light source (not shown). The lightguide 320 as illustrated is surrounded on the top and bottom by a layer of OCA 322 and 324, respectively. In general, the lightguide 320 functions to propagate light from the light source (not shown) towards the top surface of the display stack 300, thus illuminating the content presented on the display. The layers of OCA 322 and 324 may be positioned above and below the lightguide 320 to aid in maintaining the light generated by the light source within the lightguide 320.

In general, a touch sensor or touch component 306 includes one or more touch layers 326 and 328 (e.g., rows and/or columns that form a grid or diamond shape) applied to one or more surfaces of a substrate 330 coupled to a touch controller (not shown). For instance, in the illustrated example, the touch layer 326 (e.g., the rows) is applied to the top surface of the substrate 330 and the touch layer 328 (e.g., the columns) is applied to the bottom surface of the substrate 330 or vice versa. In some particular implementations, the touch component 306 may includes a single layer multi-touch pattern (e.g., both the rows and columns) applied to a single side of the substrate 330.

In the illustrated example, the touch component 306 resides atop the display component 308, which includes a substrate 332 and a FPL 334. In some instances, the FPL 334 includes c-ink capsules, as well as the fluid in which the capsules move up or down in as described above with reference to electronic-paper displays. In some examples, the FPL 334 may include a plastic film structure onto which the e-ink is coated using a roll-to-roll process. Thereafter, a conductive transparent electrode plastic film may be combined with an adhesive layer and a release sheet to form one implementation of the FPL 334.

Figure 4:
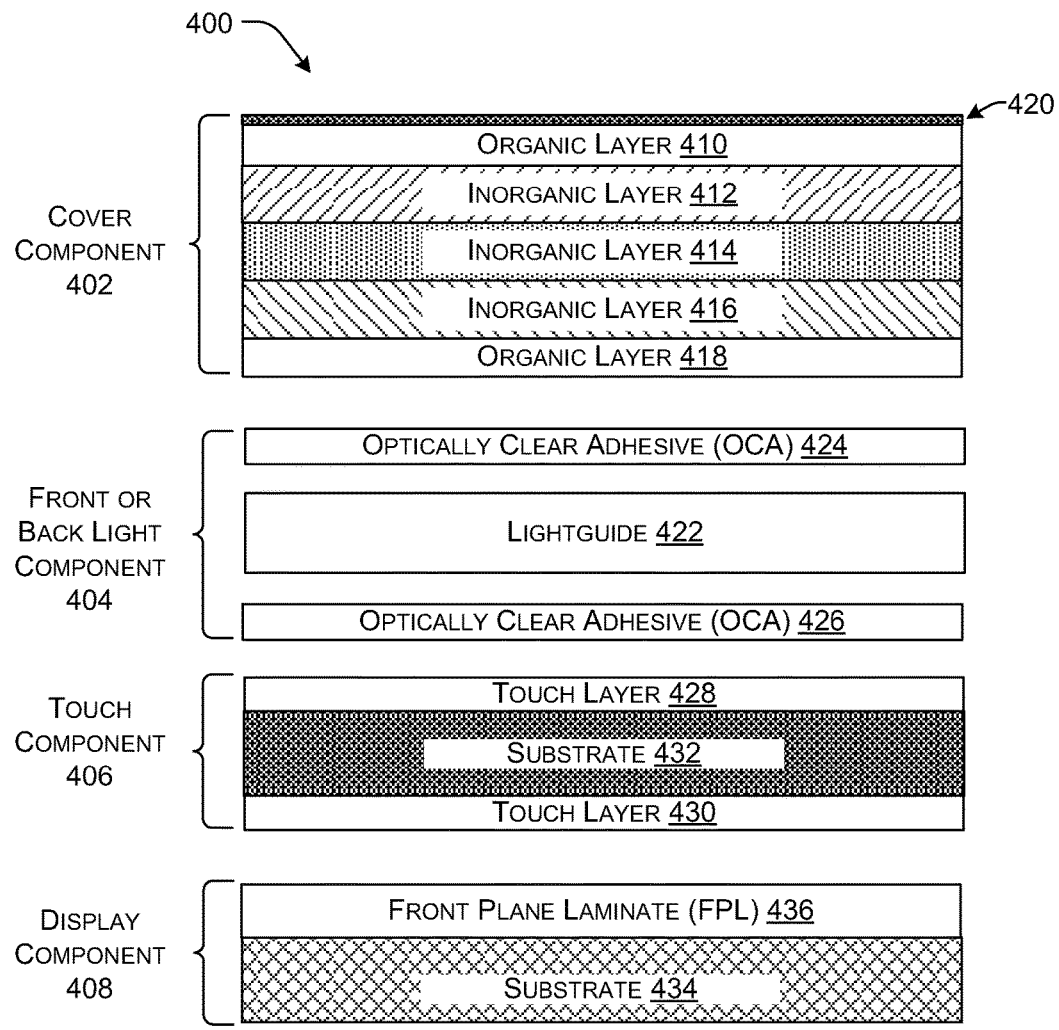
FIG. 4 illustrates an example schematic cross-section of a display stack of an electronic device.

FIG. 4 illustrates an example schematic cross-section of a display stack 400 of an electronic device. The display stack 400 of includes individual layers including a composite cover component 402, a front or back light component 404, a touch layer 406, and a display component 408. In general, the cover component 402 is formed from outer layers 410 and 418 formed from a transparent organic material and inner layers 412-416 formed from a transparent inorganic materials. In the illustrated example, the cover component 402 is a reduced weight cover component 402 having a specific flexibility, such as for use in a curved display or device.

For instance, by replacing some of the layers with the organic materials the overall weight of the electronic device may be reduced. Additionally, by forming the outer layers from an organic material, the display stack 400 may have a desired flexibility, for example, a bendable display. In this example, the bendable display may be combined with one or more sensors to determine a location associated with a user depressing a portion of the electronic device, and to associate the depression as a user input. In some examples, the one or more of the organic layers 410 and 418 may include a material having antiglare properties, antireflective properties, and UV properties. In some specific instances, an outer coating or film 420 that is resistant to scratches caused by objects having a hardness rating less than the predefined threshold may apply to an outer surface of the layer 410. In other instances, the film 420 may be a hard coating, embossing, or nanostructure having antireflective and/or anti-refractive properties.

In the illustrated example, the front or back light component 404 generally includes a lightguide 422 connected to a light source (not shown). The lightguide 422 as illustrated is surrounded on the top and bottom by a layer of OCA 424 and 426, respectively. In general, the lightguide 422 functions to propagate light from the light source (not shown) towards the top surface of the display stack 400, thus illuminating the content presented on the display. The layers of OCA 424 and 426 may be positioned above and below the lightguide 422 to aid in maintaining the light generated by the light source within the lightguide 422.

In general, as discussed above, a touch sensor or touch component 406 includes one or more touch layers 428 and 430 (e.g., rows and/or columns that form a grid or diamond shape) applied to one or more surfaces of a substrate 432 coupled to a touch controller (not shown). For instance, in the illustrated example, the touch layer 428 (e.g., the rows) is applied to the top surface of the substrate 432 and the touch layer 430 (e.g., the columns) is applied to the bottom surface of the substrate 432 or vice versa. In some particular implementations, the touch component 406 may includes a single touch layers, e.g., a single layer multi-touch pattern (e.g., both the rows and columns) applied to a single side of the substrate 432.

In the illustrated example, the touch component 406 resides atop the display component 408, which includes a substrate 434 and a FPL 436. As discussed above, the FPL 436 may include e-ink capsules, as well as the fluid in which the capsules move up or down in as described above with reference to electronic-paper displays.

While the illustrated examples of FIGS. 3 and 4 include three inner layers, either organic or inorganic, it should be understood that any number of inner layers may be utilized to form the composite cover component. Additionally, in some specific instances, the top layer may be formed from an inorganic material and bottom layers may be formed from an organic material. Likewise, in some examples, the top layer and at least one inner layer may be formed from inorganic materials, while the bottom layer is formed from organic materials. Similarly, the bottom layer and at least one inner layer may be formed from inorganic materials, while the top layer and at least one of the inner layers are formed from organic materials, as illustrated below with respect to FIG. 5.

Figure 5:
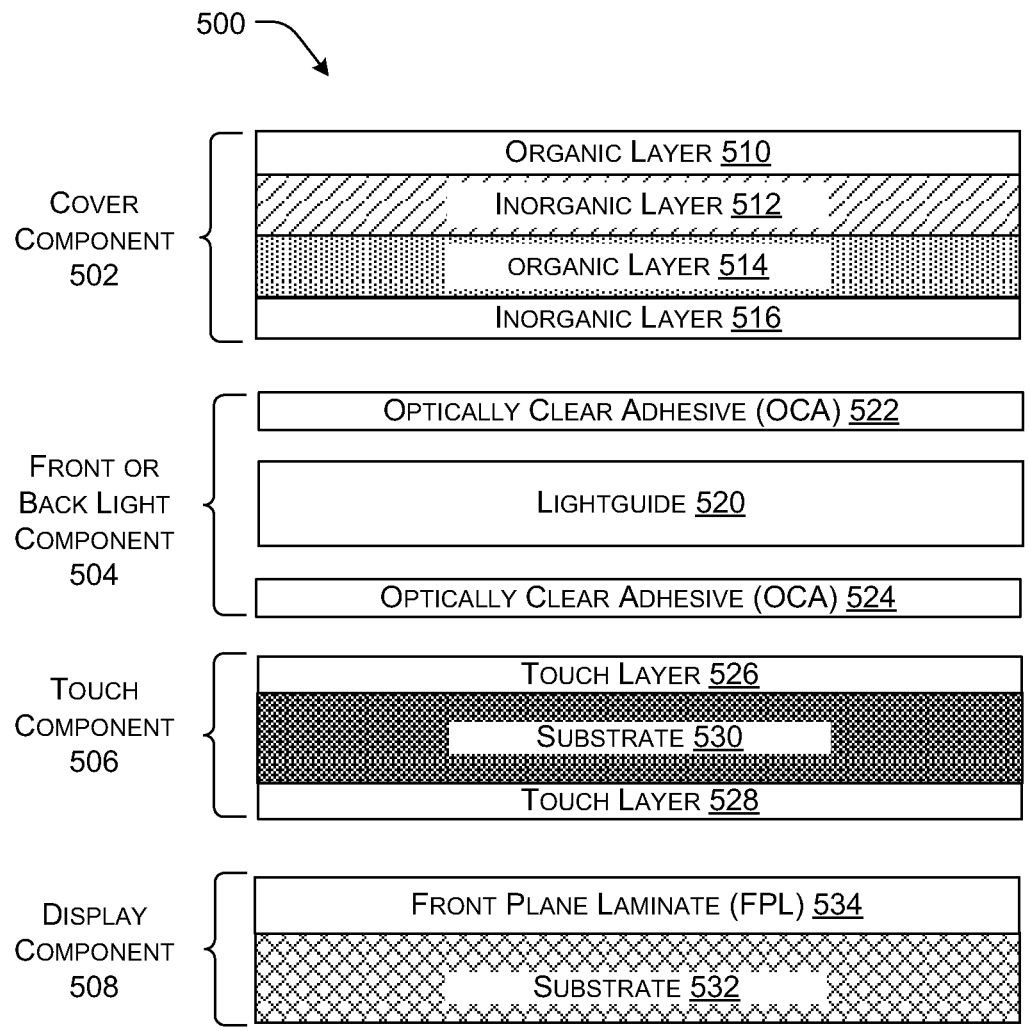
FIG. 5 illustrates an example schematic cross-section of a display stack of an electronic device.

FIG. 5 illustrates an example schematic cross-section of a display stack 500 of an electronic device. The display stack 500 includes individual layers including a composite cover component 502, a front or back light component 504, a touch layer 506, and a display component 508. In general, the cover component 502 is formed from outer layers 510 and 516 and inner layers 512 and 514. In the illustrated example, the top layer 510 and one of the inner layers 514 are formed from transparent organic materials for weight reduction and the bottom layer 516 and one of the inner layers 512 are formed from transparent inorganic materials to provide sufficient rigidness to the device, as described above. Thus, in the illustrated implementation, the outer layers 510 and 516 and the inner layers may be formed from different types of materials (e.g., one from inorganic materials and one from organic materials. Additionally, in the illustrated example, the layers 510 and 514 are formed from an organic material and the layers 512 and 516 are formed from inorganic materials, other combinations are possible. For instance, in some examples, the top layer 510 may be formed from an inorganic material and the other layers 512-516 may be organic.

In the illustrated example, the front or back light component 504 generally includes a lightguide 520 connected to a light source (not shown). The lightguide 520 as illustrated is surrounded on the top and bottom by a layer of OCA 522 and 524, respectively. In general, the lightguide 6520 functions to propagate light from the light source (not shown) towards the top surface of the display stack 500, thus illuminating the content presented on the display. The layers of OCA 522 and 524 may be positioned above and below the lightguide 520 to aid in maintaining the light generated by the light source within the lightguide 520.

In general, as discussed above, a touch sensor or touch component 506 includes one or more touch layers 526 and 528 (e.g., rows and/or columns that form a grid or diamond shape) applied to one or more surfaces of a substrate 530 coupled to a touch controller (not shown).

Figure 6:
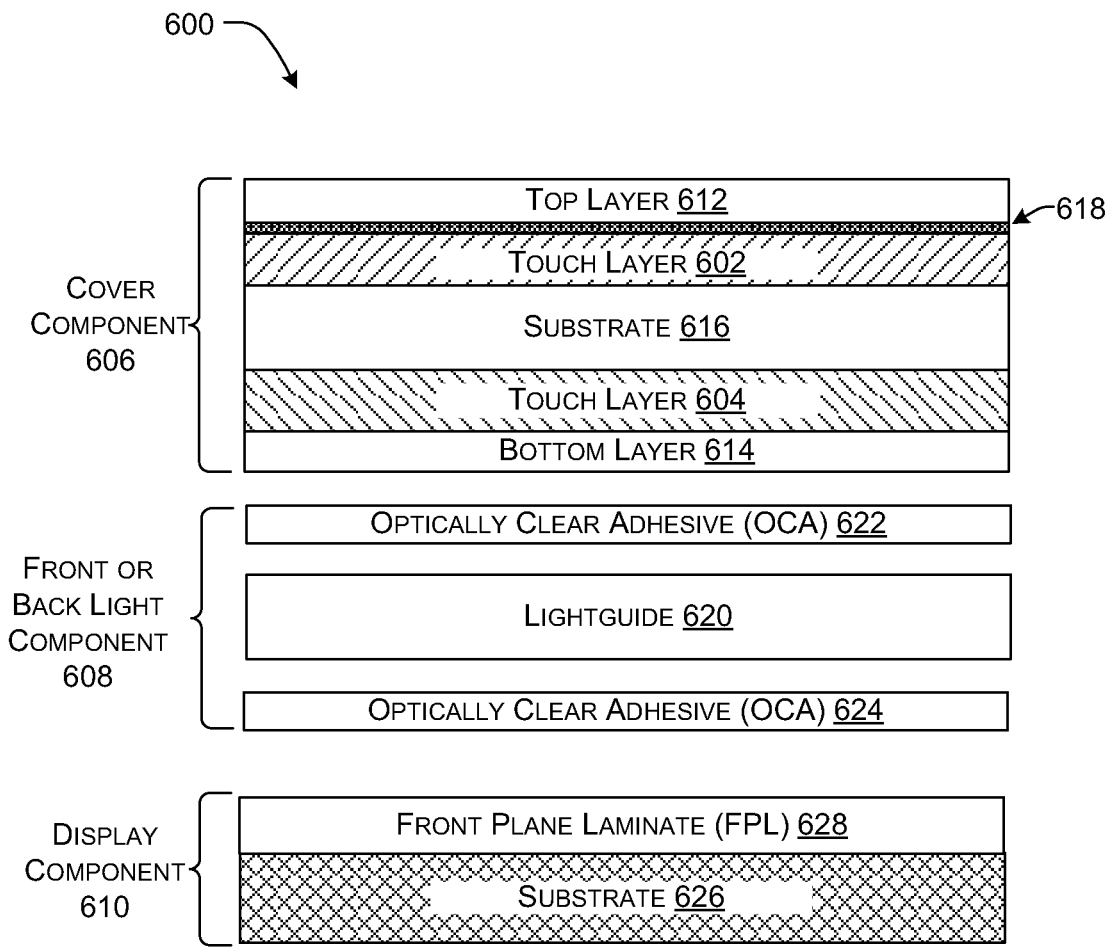
FIG. 6 illustrates an example schematic cross-section of a display stack of an electronic device having a touch layer incorporated into a cover component.
Figure 7:
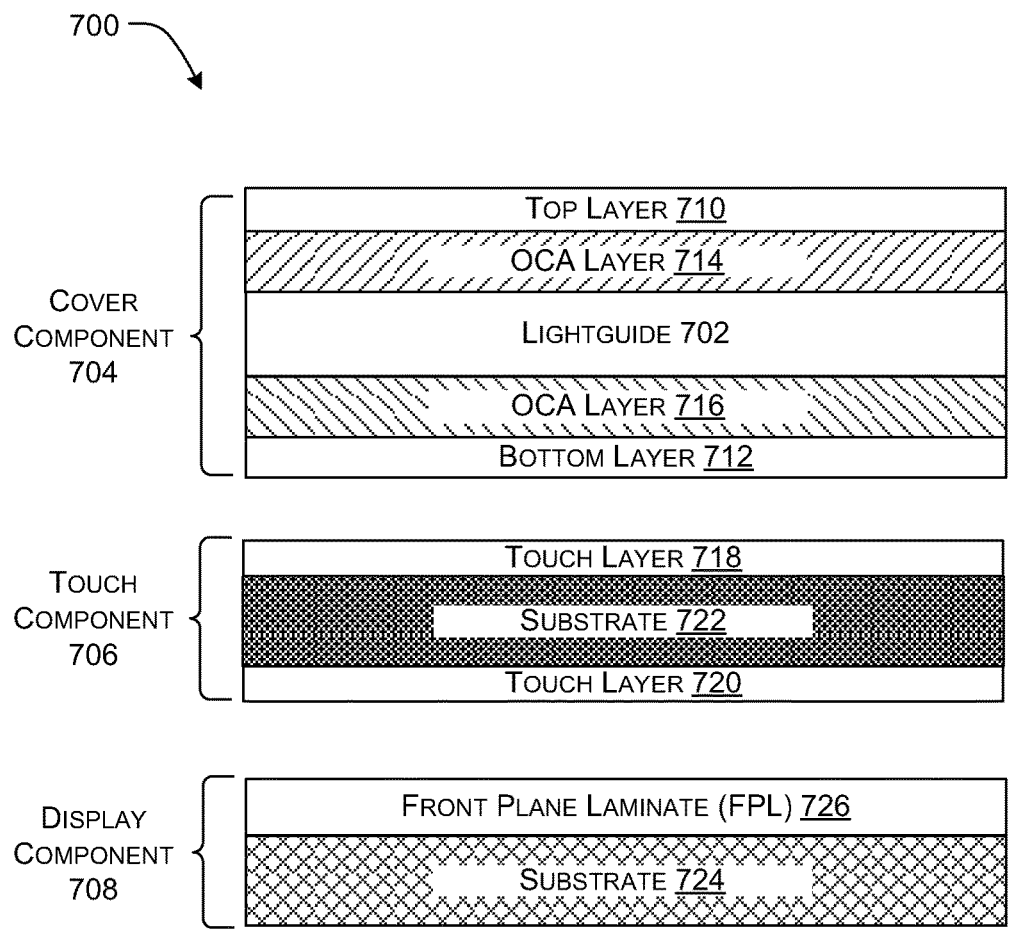
FIG. 7 illustrates an example schematic cross-section of a display stack of an electronic device having a lightguide incorporated into a cover component.

In the illustrated example, the touch component 506 resides atop the display component 508, which includes a substrate 532 and a FPL 534. As discussed above, the FPL 534 may include e-ink capsules, as well as the fluid in which the capsules move up or down in as described above with reference to electronic-paper displays. In general, the examples illustrated in FIGS. 1-5 include a display stack having a cover component, a front or back light component, a touch component, and a display component. FIG. 6 illustrates an example of the touch component (e.g., the touch layers) incorporated into one or more of the inner layers of the cover component and FIG. 7 illustrate examples of light component (e.g., the lightguide and OCA layers) being incorporated into one or more of the inner layers of the cover component.

FIG. 6 illustrates an example schematic cross-section of a display stack 600 of an electronic device having a touch layers 602 and 604 incorporated into a cover component 606. In general, the display stack 600 includes the composite cover component 606, a front or back light component 608, and a display component 610. In one implementation, the cover component 606 has a top layer 612 and a bottom layer 614 formed from a transparent inorganic material to provide rigidity and stiffness to the display stack 600, as well as to provide a hardness rating of 3H pencil or greater to prevent scratching or chipping of the outer surface of the display.

The inner layers of the composite cover component 606 may include a first touch layer 602 contacted with a top of a substrate 616 and a second touch layer 604 contacted with the bottom surface of the substrate 616. In some cases, the substrate 616 may be formed from a transparent organic material, such as polyurethane, PMMA, PC, PT, silicone, COP or COC, or a copolymer formed from a combination thereof, to reduce the overall weight of the cover component 606. In some instances, the touch layers 602 and 604 may be a single multi-layer touch pattern applied to a single side of the substrate 616 or sandwiched directly between the top layer 612 and the bottom layer 614. In either instance, by including the touch layer between the top layer 612 and the bottom layer 614, the typically issues associated with weakening the coverglass related to depositing ITO directly on the bottom surface of the coverglass may be avoided and the overall thickness of the display stack may be reduced. Additionally, by including the touch layer between the top layer 612 and the bottom layer 614, the overall number of components in the display stack 600 may be reduce (e.g., the touch sensor is no longer incorporate into a separate component) and, in those regards, various manufacturing steps (such as one or more steps associated with forming the touch component) may be eliminated resulting in lower manufacturing costs.

The touch layers 602 and 604 may be formed in various manners. For example, the touch layers 602 and 604 may be formed by coating the surfaces of the substrate 616 with a conductive material and selectively etching touch patterns from the conductive material. In other examples, a metal mesh or pre-formed touch pattern may be adhered or laminated to the surfaces of the substrate 616 to from the touch layers 602 and 604. In still other examples, the touch layers 602 and 604 may be printed upon the surfaces of the substrate 616 before the composite cover component 606 is laminated. In some instances, the touch layers 602 and 604 may be formed from a copper or copper-based alloy, silicon or a silicon-based alloy, gold or a gold-based alloy, sliver a sliver-based alloy, carbon or a carbon-based alloy, among others. In some particular examples, the touch layer may be formed from ITO, carbon nanotubes, and/or silver nanowiring. In one specific example, traces of ITO may be deposited or patterned (e.g., to form a diamond or grid) onto the surfaces of the substrate 616 using physical vapor deposition, electron beam evaporation, or sputter deposition techniques among others. While in the illustrated example, two touch layers 602 and 604 are shown, in some particular implementations, a single touch layers, e.g., a single layer multi-touch pattern (e.g., both the rows and columns) may be applied to a single side of the substrate 616.

In some specific examples, the cover component 606 may also include an additional layer 618, for instance, place above the touch layers 602 and 604 for use as a UV layer to protect the touch layers 602 and 604. In some cases, the additional layer 618 may be an inorganic material, while in other cases the additional layer 618 may be an organic material. In some implementations, the additional layer 618 may include a material having antiglare properties, antireflective properties, and UV properties.

In the illustrated example, the front or back light component 608 generally includes a lightguide 620 connected to a light source (not shown). The lightguide 620 as illustrated is surrounded on the top and bottom by a layer of OCA 622 and 624, respectively. In general, the lightguide 620 functions to propagate light from the light source (not shown) towards the top surface of the display stack 600, thus illuminating the content presented on the display. The layers of OCA 622 and 624 may be positioned above and below the lightguide 620 to aid in maintaining the light generated by the light source within the lightguide 620.

In the illustrated example, the touch component 608 resides atop the display component 610, which includes a substrate 626 and a FPL 628. As discussed above, the FPL 628 may include e-ink capsules, as well as the fluid in which the capsules move up or down in as described above with reference to electronic-paper displays.

FIG. 7 illustrates an example schematic cross-section of a display stack 700 of an electronic device having a lightguide 702 incorporated into a cover component 704. In general, the display stack 700 includes the composite cover component 704, a front or back light component 706, and a display component 708. In one implementation, the cover component 704 has a top layer 710 and a bottom layer 714 formed from a transparent inorganic material to provide rigidity and stiffness to the display stack 700, as well as to provide a hardness rating of 3H pencil or greater to prevent scratching or chipping of the outer surface of the display.

The inner layers of the composite cover component 704 may include a first OCA layer 714 contacted with a top of the lightguide 702 and a second OCA layer 716 contacted with the bottom surface of the lightguide 702. In some examples, the lightguide 702 may include a substrate (not shown) formed from a transparent thermoplastic (such as PMMA), a layer of lacquer and multiple grating elements that function to propagate light from the light source towards the top surface of the display stack 700, thus illuminating the content presented on the display. For example, the lightguide 702 may be formed by applying a layer of lacquer to the substrate to create the grating elements of the lightguide 702, the grating elements may be embossed to the layer of lacquer, and the lightguide 702 may be UV-cured. Alternatively, the substrate of the lightguide 702 and the grating elements may be manufactured as a single element, such as via an injection molding process. In some instances, the UV lacquer is made of a cross-linked, tri-functional polymer material that co-polymerizes to a plastic solid when exposed to a high-intensity UV light source.

The OCA layers 714 and 716 may be around the lightguide 702 to prevent errant light from escaping the lightguide 702 in an undesirable manner. In some instances the OCA layers may include multiple types of OCA, for instance, the first OCA layer 714 may include a first type of OCA having predetermined ultra-violate (UV) properties and the second type of OCA having determined refractive properties. In some cases, OCA layers 714 and 716 may be applied by depositing the OCA onto the lightguide 702 and, when the OCA reaches the corners of the display stack 700, the corners may be UV-cured. Thereafter, the OCA on the remaining portion of the lightguide 702 may be UV-cured. In other instance, the LOCA or the SOCA may be formed from an acrylic material and/or, in some instances, from silicone. For instance, the LOCA may comprise Loctite® 6192 and/or MSDS made by Nalax3®. The MSDS comprises UV-curable polyurethane acrylates based a formulation comprising of hexamethylene diacrylate, Urethane acrykate oligomer, Acyrlate ester and photoinitator. This formulation may achieve balanced coating properties such as tensile properties, hardness, weather ability, and adhesion. The LOCA may be created by applying the formulation to PMMA rolls using a wet coating method immediately followed by embossing and UV curing (e.g., using a Fusion lamp). In some particular instances, the material selected for inclusion in the OCA layers 714 and 716 may be selected based in part on the optical properties of the material and in part on the density of the material.

In general, a touch sensor or touch component 706 includes one or more touch layers 718 and 720 (e.g., rows and/or columns that form a grid or diamond shape) applied to one or more surfaces of a substrate 722 coupled to a touch controller (not shown). For instance, in the illustrated example, the touch layer 718 (e.g., the rows) is applied to the top surface of the substrate 722 and the touch layer 720 (e.g., the columns) is applied to the bottom surface of the substrate 722 or vice versa. In some particular implementations, the touch component 706 may includes a single touch layers, e.g., a single layer multi-touch pattern (e.g., both the rows and columns) applied to a single side of the substrate 722. In another particular implementation, the single layer multi-touch pattern may be applied, for example, using ITO deposition to the bottom surface of the bottom layer 712 of the composite cover component 704. In this implementation, both the light component and the touch component may be incorporated into the cover component 704, further reducing the overall layers associated with the display stack 700.

In the illustrated example, the touch component 706 resides atop the display component 708, which includes a substrate 724 and FPL 726. As described above, the FPL 726 may include e-ink capsules, as well as the fluid in which the capsules move up or down in as described above with reference to electronic-paper displays.

Figure 8:
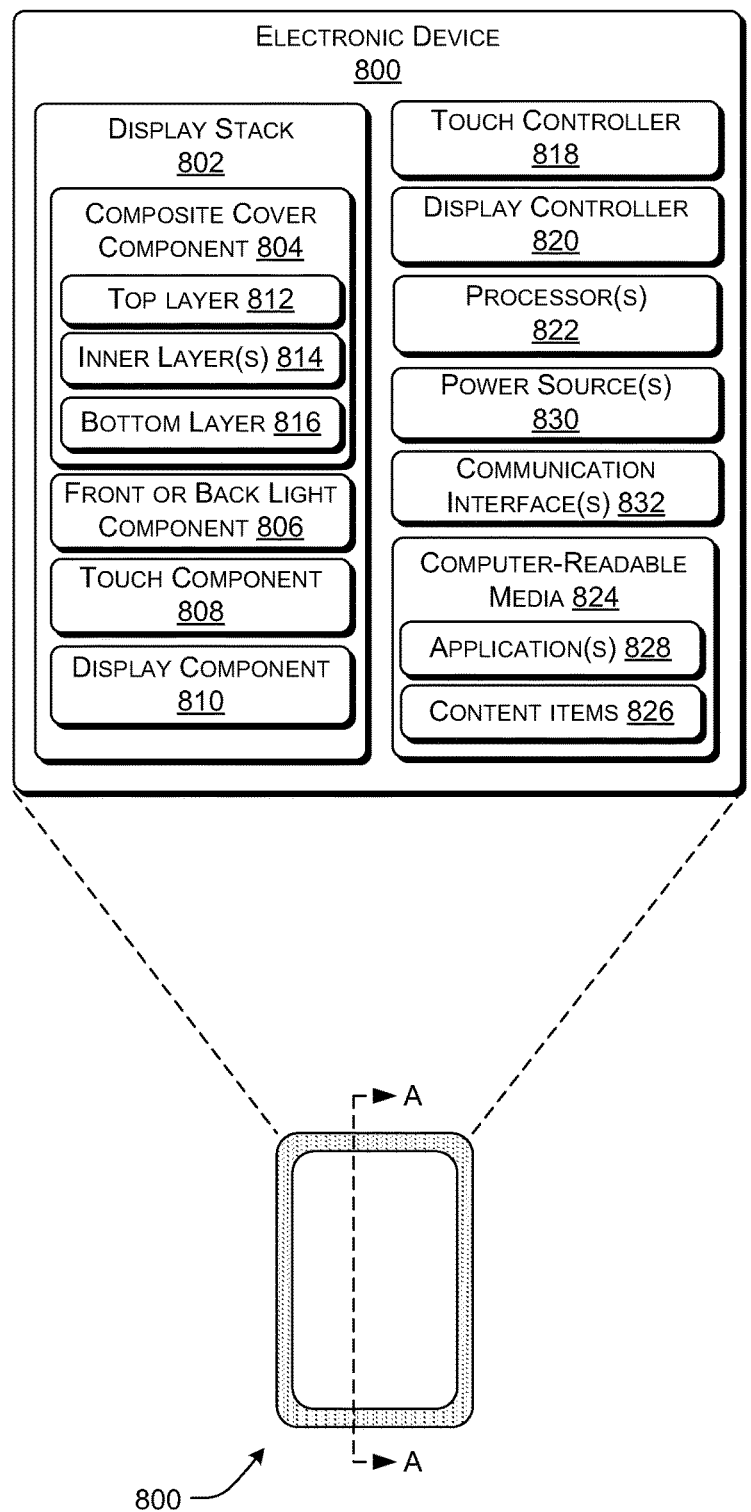
FIG. 8 illustrates an example electronic device including a display stack with a composite cover component.

FIG. 8 illustrates an example electronic device 800 that includes a display stack 802 with a composite cover component 804. The device 800 may comprise any type of mobile electronic device (e.g., an electronic book reader, a tablet computing device, a laptop computer, a multifunction communication device, a portable digital assistant (PDA), etc.) or non-mobile electronic device (e.g., a desktop computer, a television, etc.). In addition, while FIG. 8 illustrates several example components of the electronic device 800, it should be appreciated that the device 800 may also include other conventional components, such as an operating system, system busses, input/output components, and the like.

The display stack 802 includes the cover component 804, a front or back light component 806, a touch component 808 and a display component 810. In one implementation, the cover component 804 includes at least a top layer 812, one or more inner layers 814, and a bottom layer 816. In general, the cover component 804 may be formed from various layers 812-816 in order to reduce the overall weight of the device 800 and/or to increase the flexibility of the device 800. For instance, by substituting portions of the cover component 804 typically formed from glass with a plastic or polymer material, a cover component 804 may be manufactured at reduced weight, as the plastic or polymer material may have a density of less than half that typically associated with glass materials.

In some cases, the cover component 804 may be configured to protect the display from damage, such as scratching, chipping, peeling, as well as to provide rigidity and stiffness to the overall electronic device 800. Thus, the cover component 104 may be configured to run the entire width and height of the electronic device 800 and also be manufactured to have a hardness rating that is resistant to at least 3H pencil. In this case, the top layer 812 and the bottom layer 816 may be formed from a transparent inorganic material and the inner layers 814 may be formed from transparent organic material having a specific density less than a density associated with the material of the top and bottom layers 812 and 816.

In some instances, the transparent inorganic materials may be glass, sapphire, ceramic aluminum or combination thereof and the transparent organic materials may be polyurethane, PMMA, PC, PT, silicone, COP, COC, or a combination thereof. In some instances, different transparent inorganic materials may be used for the top layer 812 and the bottom layer 816 and different transparent organic materials may be utilized for each layer of the inner layers 814. By utilizing transparent inorganic materials as the outer most layer (i.e., the top layer 812), the cover component 804 is able to provide a desired hardness rating and, by utilizing transparent inorganic materials in the top and bottom layers 812 and 816, the cover component 804 may maintain a sufficient rigidity and stiffness. However, by utilizing a transparent organic material as the inner layers 814, the cover component 804 may be manufactured at a reduced weight, as the organic material is less dense than the inorganic materials being replaced.

In other implementations, the cover component 804 may be manufactured for a desired flexibility, for instance, in use in curved displays such as those typically associated with wrist watch displays. In these implementations, the top and bottom layers 812 and 816 may be formed from transparent inorganic materials and the inner layers 814 may be formed from the transparent organic materials. Again, by replacing some of the inorganic materials with organic materials, the overall weight may be reduced, as the density of the organic materials is much lower than that of the inorganic materials. However, by sandwiching the organic material around the inorganic material, a display stack 802 may be manufactured having some flexibility but sufficient rigidity to prevent cracking or snapping by an end user.

In some examples, the inner layers 814 may include an antiglare layer, antireflective layer, UV layer to provide additional properties, in addition to the weight reduction. For example, one or more of the inner layers 814 may be manufactured with additives such a UV-absorbing agent. In some specific instances, such as when the top layer 812 is an organic material, an outer coating or film may applied that is resistant to scratches caused by objects having a hardness rating less than the predefined threshold (e.g., 3H pencil, 5H pencil, 9H pencil, etc.). For instance, the outer coating or film may be a polyester material, a polycarbonate material, or a combination material.

The electronic device 800 may also include a front or back light component 806 for lighting the display stack 802. The front or back light component 806 may include a light guide portion and a light source. The light guide portion can include a substrate including a transparent thermoplastic polymer. For example, the light guide portion may include an acrylic polymer. In one implementation, the light guide portion can include PMMA. In a particular implementation, the light guide portion can include a substrate, a layer of lacquer and multiple grating elements formed in the layer of lacquer. The multiple grating elements may be configured to propagate light to illuminate the display component 810.

Furthermore, the amount of light emitted by the front light component 806 may vary. For instance, upon a user opening a cover of the electronic device 800, the light from the front light or back component 806 may gradually increase to its full illumination. In some instances, the electronic device 800 includes an ambient light sensor and the amount of illumination of the front or back light component 806 may be based at least in part on the amount of ambient light detected by the ambient light sensor. For example, the front or back light component 806 may be dimmer if the ambient light sensor detects relatively little ambient light, such as in a dark room; can be brighter if the ambient light sensor detects ambient light within a particular range; and may be dimmer or turned off if the ambient light sensor detects a relatively large amount of ambient light, such as direct sunlight.

The device 800 may also include a touch component 808 and a touch controller 818. In some instances, at least one touch component 808 resides atop the display component 810 to form a touch-sensitive display (e.g., an electronic paper touch-sensitive display) that is capable of both accepting user input and displaying content corresponding to the input. The touch component 808 may comprise a capacitive touch sensor, a force sensitive resistance (FSR), an interpolating force sensitive resistance (IFSR) sensor, or any other type of touch sensor. In some instances, the touch component 808 is capable of detecting touches as well as determining an amount of pressure or force of these touches.

The display stack 802 also includes a display component 810 and a corresponding display controller 820. For instance, the display stack 802 may include a display component 810 that may present content via one or more image producing technologies. In various examples, the display component 810 may include a reflective display, such as an electronic paper display, a reflective liquid crystal display (LCD), or the like. Electronic paper displays represent an array of display technologies that can mimic the look of ordinary ink on paper. In contrast to backlit displays, electronic paper displays typically reflect light, much as ordinary paper does. In addition, electronic paper displays can be bi-stable, meaning that these displays are capable of holding text or other displayed images even when very little or no power is supplied to the display. Some examples of the display component 810 that can be used with the implementations described herein include bi-stable LCDs, micro electromechanical system (MEMS) displays, such as interferometric modulator displays, cholesteric displays, electrophoretic displays, electrofluidic pixel displays, electrowetting displays, photonic ink displays, gyricon displays, and the like. In other implementations, or for other types of electronic devices 800, the display component 810 may include an active display such as a LCD, a plasma display, a light emitting diode (LED) display, an organic light emitting diode (OLED) display, and so forth. Accordingly, implementations herein are not limited to any particular display technology.

In one implementation, the display component 810 comprises an electrophoretic display that moves particles between different positions to achieve different color shades. For instance, in a pixel that is free from a color filter, the pixel may be configured to produce white when the particles within this pixel are located at the front (i.e., viewing) side of the display. When situated in this manner, the particles reflect incident light, thus giving the appearance of a white pixel. Conversely, when the particles are pushed near the rear of the display, the particles absorb the incident light and, hence, cause the pixel to appear back to a viewing user. In addition, the particle may situate at varying locations between the front and rear sides of the display to produce varying shades of gray. Furthermore, as used herein, a "white" pixel may comprise any shade of white or off white, while a "black" pixel may similarly comprise any shade of black.

In another implementation, the display component 810 comprises an electrophoretic display that includes oppositely charged light and dark particles. In order to create white, the display controller 820 can move light particles to the front side of the display component 810 by creating a corresponding charge at an electrode near the front of the display component 810 and moves the dark particles to the back of the display component 810 by creating a corresponding charge at an electrode near the back. In order to create black, meanwhile, the display controller 820 changes the polarities and moves the dark particles to the front of the display component 810 and the light particles to the back of the display component 810. Furthermore, to create varying shades of gray, the display controller 820 may utilize different arrays of both light and dark particles. In some cases, the particles may be contained in individual transparent capsules. In a particular example, the capsules can have a diameter included in a range of 35 micrometers to 45 micrometers. The capsules can be suspended in a fluid, such as a liquid polymer, between a transparent upper electrode grid layer and a lower electrode grid layer separated by a gap of approximately 50 micrometers to 200 micrometers.

In still another implementation, the display component 810 may include an electrowetting display that employs an applied voltage to change the surface tension of a liquid in relation to a surface. For instance, by applying a voltage to a hydrophobic surface, the wetting properties of the surface may be modified so that the surface becomes increasingly hydrophilic. As one example of an electrowetting display, the modification of the surface tension acts as an optical switch by contracting a colored oil film when a voltage is applied to individual pixels of the display. When the voltage is absent, the colored oil forms a continuous film within a pixel, and the color may thus be visible to a user of the display. On the other hand, when the voltage is applied to the pixel, the colored oil is displaced and the pixel becomes transparent. When multiple pixels of the display are independently activated, the display can present a color or grayscale image. The pixels may form the basis for a transmissive, reflective, or transmissive/reflective (transreflective) display. Further, the pixels may be responsive to high switching speeds (e.g., on the order of several milliseconds), while employing small pixel dimensions. Accordingly, the electrowetting displays herein may be suitable for applications such as displaying video content. In addition, the lower power consumption of electrowetting displays in comparison to conventional LCDs makes the technology suitable for displaying content on portable devices that rely on battery power.

In some examples, the settings of the display component 810 may vary depending on the state of the front or back light component 806 (e.g., on or off), or based on the amount of light provided by the front or back light component 806. For instance, the electronic device 800 may implement a larger default font or a greater contrast when the front or back light component 806 is off compared to when the front light component 806 is on. In some instances, the electronic device 800 maintains, when the front or back light component 806 is on, a contrast ratio for the display component 810 that is within a certain defined percentage of the contrast ratio when the front or back light component 806 is off.

The electronic device 800 also includes one or more processors 822 and computer-readable media 824. Depending on the configuration of the electronic device 800, the computer-readable media 824 may be an example of tangible non-transitory computer storage media and may include volatile and nonvolatile memory and/or removable and non-removable media implemented in any type of technology for storage of information such as computer-readable instructions or modules, data structures, program modules or other data. Such computer-readable media may include, but is not limited to, RAM, ROM, EEPROM, flash memory or other computer-readable media technology, CD-ROM, digital versatile disks (DVD) or other optical storage, magnetic cassettes, magnetic tape, solid state storage, magnetic disk storage, RAID storage systems, storage arrays, network attached storage, storage area networks, cloud storage, or any other medium that can be used to store information and which can be accessed by the processors 822.

The computer-readable media 824 may be used to store any number of functional components that are executable on the processors 822, as well content items 826 and applications 828. Thus, the computer-readable media 824 may include an operating system and a storage database to store one or more content items, such as eBooks, audio books, songs, videos, still images, and the like. The computer-readable media 824 of the electronic device 800 may also store one or more content presentation applications to display content on the device 800. The content presentation applications may be implemented as various applications 828 depending upon the content items 826. For instance, one of the applications 828 may be an electronic book reader application for rending textual electronic books, an audio player for playing audio books or songs, a video player for playing video, and so forth.

The electronic device 800 may also includes one or more power sources 830 for providing power to the display stack 802 and one or more communication interfaces 832 to facilitate communication between one or more networks (such as the Internet or one or more local area networks) and/or directly with one or more devices. The communication interfaces 832 may also facilitate communication between one or more wireless access points, a master device, and/or one or more other computing devices as part of an ad-hoc or home network system. The communication interfaces 832 may support both wired and wireless connection to various networks, such as cellular networks, radio, WiFi networks, short-range or near-field networks (e.g., Bluetooth®), infrared signals, local area networks, wide area networks, the Internet, and so forth.

Figure 9:
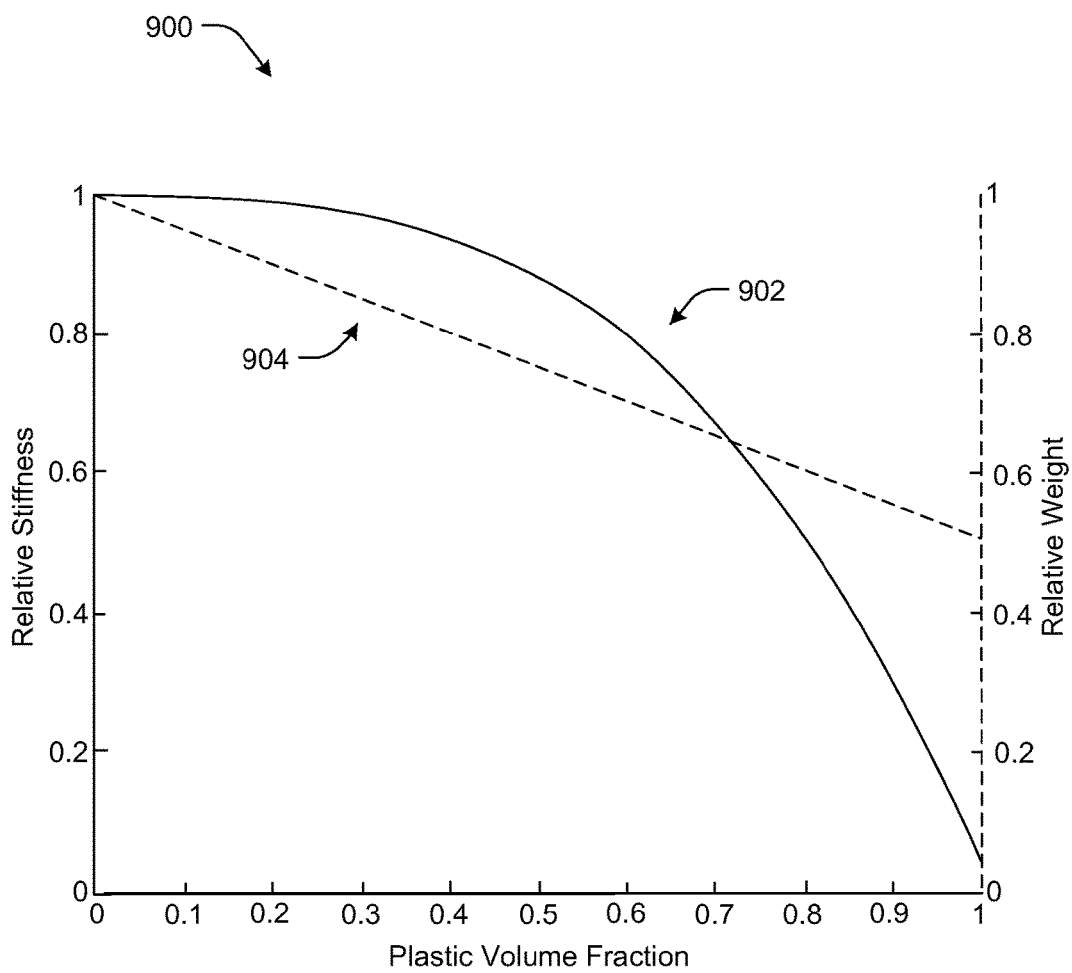
FIG. 9 illustrates an example graph showing relative stiffness versus relative weight as the volume fraction of plastic in the cover component is increased.

FIG. 9 illustrates an example graph 900 showing relative stiffness versus relative weight as the volume fraction of plastic in the cover component is increased. The illustrate example, line 902 of the graph 900 shows the change in relative stiffness of a cover component 0.7 mm thick as the volume fraction of plastic is increased from zero to 100%. Likewise, the line 904 of the graph 900 shows the change in relative weight of the 0.7 mm cover component as the volume fraction of plastic is increased from zero to 100%.

In the illustrated example, line 902 shows that the relative stiffness of a cover component formed fully from a plastic or inorganic material has a stiffness of less than 10% that of the original glass or inorganic cover component. Similarly, line 904 shows that the relative weight of a cover component formed fully from a plastic or organic material has a weight of about 50% that of the original glass cover component. In some implementations, the plastic volume fraction of the coverglass may be in the range of 0.3 to 0.5 and having a relative stiffness between 70-90% and a relative weight between 70-80% that of the all glass cover component. In one specific example, the cover component may have plastic volume fraction of 0.4, a relative stiffness of 80% of an all glass cover component, and a relative weight of 80% of the all glass cover component.

FIGS. 10-14 are flow diagrams illustrating example processes for generating a composite cover component as described above. The processes are illustrated as a collection of blocks in a logical flow diagram, which represent a sequence of operations, some or all of which can be implemented in hardware, software or a combination thereof. In the context of software, the blocks represent computer-executable instructions stored on one or more computer-readable media that, which when executed by one or more processors, perform the recited operations. Generally, computer-executable instructions include routines, programs, objects, components, data structures and the like that perform particular functions or implement particular abstract data types.

The order in which the operations are described should not be construed as a limitation. Any number of the described blocks can be combined in any order and/or in parallel to implement the process, or alternative processes, and not all of the blocks need be executed. For discussion purposes, the processes herein are described with reference to the frameworks, architectures and environments described in the examples herein, although the processes may be implemented in a wide variety of other frameworks, architectures or environments.

Figure 10:
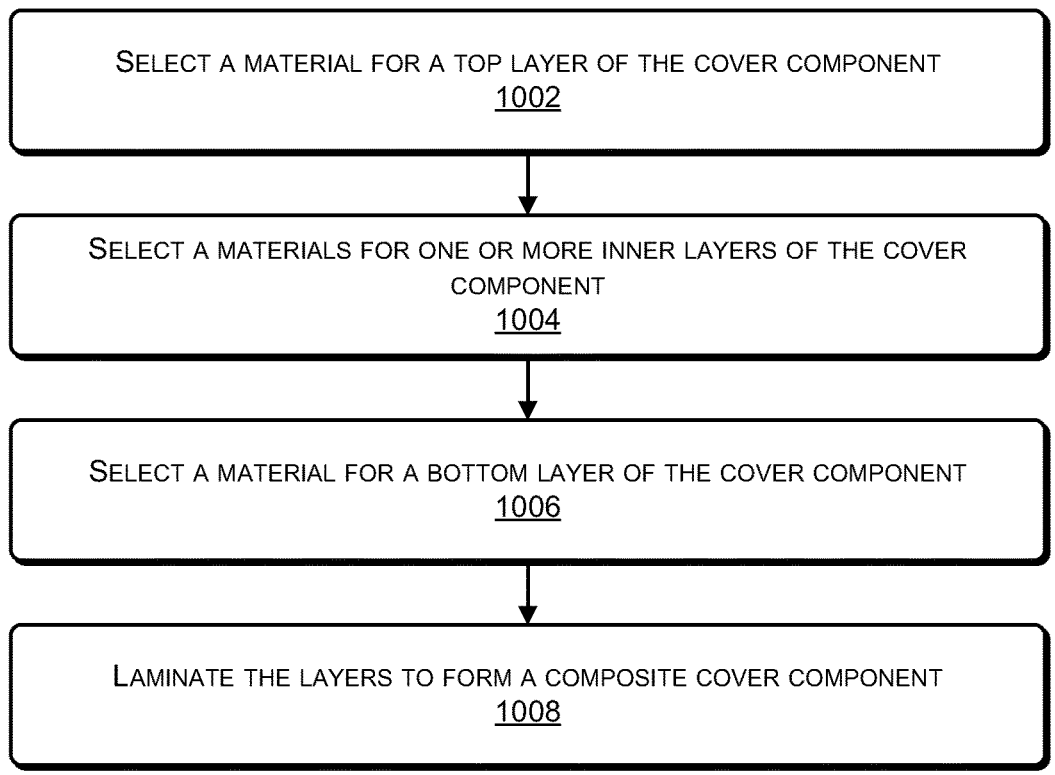
FIG. 10 illustrates an example flow diagram showing an illustrative process for forming the composite cover component of the display stack of FIGS. 1-5.

FIG. 10 illustrates an example flow diagram showing an illustrative process 1000 for forming the composite cover component of the display stack of FIGS. 1-6. For example, a display stack may include a cover component, a front or back light component, a touch component, and a display component. In general, the composite cover component includes a top layer, one or more inner layers, and a bottom layer stacked atop the front or back light component, the touch component, and the display component.

At 1002, a material is selected for the top layer of the composite cover component. In some examples, the material may be a transparent inorganic material, such as glass, sapphire, or a ceramic aluminum. For instance, the inorganic material may be used when the outer surface of the display stack has a desired hardness rating or rigidity. In other examples, a transparent organic material may be selected, such as polyurethane, PMMA, PC, PT, silicone, COP, COC, or a copolymer formed from a combination thereof. The organic material may be selected for the top layer when some level of flexibility is desired in the display stack, for instance, in an electronic device including a user interface in which the user may enter inputs by depressing various portions of the display or housing of the device.

At 1004, a material is selected for one or more inner layers of the composite cover component. In some examples, the material of the inner layers may be a transparent inorganic material, while in other examples, a transparent organic material may be selected. For instance, organic materials may be selected in lieu of inorganic materials for the inner layers, as the organic materials typical result in a cover component with a weight reduction of up to 50% by volume.

At 1006, a material is selected for the bottom layer of the composite cover component. In some examples, the material may be a transparent inorganic material, such as glass, sapphire, or a ceramic aluminum. In other examples, a transparent organic material may be selected, such as polyurethane, PMMA, PC, PT, silicone, COP, COC, or a copolymer formed from a combination thereof. In some instances, the material selected for the bottom layer may be selected to match the type of material selected for the top layer. For example, both the top layer and bottom layer may be an inorganic material to ensure the composite cover component has sufficient stiffness to maintain the overall shape of the electronic device.

At 1008, the layers are laminated to form the composite cover component. For example, the layers may be laminated together using techniques, such as vacuum lamination, roll-to-roll lamination, piece by piece lamentation, etc. For instance, in one example, the layers may be laminated in a vacuum under a pressure of 50 Pascal (Pa) or less for 20 to 30 seconds. In another instance, the a roll-to-roll lamination process performed at a temperature included in a range of about 15° C. to about 40° C. to combined the layers. In some implementations, the cover component 104 may be produced by coupling the layers 112-116 and then applying heat and an external force. For example, the heat and external force may be applied in an autoclave chamber at pressure included in a range of about 10 Pa to about 300 Pa for 20 to 50 seconds. In one implementation, the cover component may be produced by heating the layers at a temperature included in a range of about 25° C. to about 80° C. In another instance, the cover component may be produced by heating the layers at a temperature included in a range of about 40° C. to about 60° C.

In other implementations, the layers may be laminated using optically clear adhesives (OCA) (e.g., an adhesive film, gel, or tape) to form the cover component. For example, a first layer of OCA placed between layer and a second layer of OCA place between layers. The OCA layers may be cut to have dimensions that correspond to dimensions of the display stack and the OCA layers may be UV cured. For instance, a first cycle of UV radiation may be applied to the first OCA layer followed by applying a second cycle of UV radiation to the second OCA layer. In additional instances, multiple first cycles of UV radiation (e.g., 2 to 250 seconds of UV expose) may be applied to the first OCA layer followed by multiple second cycles of UV radiation applied to the second OCA layer. In various implementations, a period of time can elapse between applying cycles of UV radiation to the OCA layers, for example, a period of time having a duration included in a range of 2 seconds to 30 seconds can elapse between applying cycles of radiation to the first adhesive. In one specific example, the OCA may be applied by a roller process at a pressure included in a range of 50 kPa to 250 kPa.

FIG. 11 illustrates another example flow diagram showing an illustrative process 1100 for forming the composite cover component of the display stack of FIGS. 1-5. For example, a display stack may include a cover component, a front or back light component, a touch component, and a display component. In general, the composite cover component includes a top layer, one or more inner layers, and a bottom layer stacked atop the front or back light component, the touch component, and the display component.

At 1102, a bottom surface of a first inner layer of the cover component is contacted with a top surface of the second inner layer of the cover component. For example, in some implementations, multiple inner layers are included within the composite cover component, for instance, to generate a cover component having multiple predefined properties. For example, the first inner layer may be formed from an organic material having a predefined refractive index (e.g., a refractive index in the range of 1.39 to 1.51) and the second dinner layer may be formed from a martial having a predefined luminous transmittance (e.g., less than 10% below 400 nm wavelength and greater than 90% over 400 nm wavelength).

At 1104, the first and second inner layers are laminated together. For example, the inner layers may be laminated together using techniques, such as vacuum lamination, roll-to-roll lamination, piece by piece lamentation, etc. For instance, in one example, the inner layers may be laminated in a vacuum under a pressure of 50 Pa or less for 20 to 30 seconds. In another instance, the a roll-to-roll lamination process performed at a temperature included in a range of about 15° C. to about 40° C. to combined the inner layers.

In one implementation, the inner layers may be combined by heating the layers at a temperature included in a range of about 25° C. to about 80° C. In another instance, the inner layers are laminated by heating the layers at a temperature included in a range of about 40° C. to about 60° C.

In other implementations, one or more of the inner layers may be an OCA which may be UV cured to combine the first and second inner layers. For instance, a one or more cycles of UV radiation may be applied to the OCA. In example, multiple cycles of UV radiation (e.g., 2 to 250 seconds of UV expose) may be applied to the OCA. In various implementations, a period of time can elapse between applying cycles of UV radiation to the OCA. In one specific example, the OCA may be applied by a roller process at a pressure included in a range of 50 kPa to 250 kPa.

At 1106, a bottom surface of a top layer of the cover component is contacted with a top surface of the first inner layer. For example, the top layer may be an inorganic material (e.g., glass, sapphire, or ceramic aluminum) selected to provide a desired hardness rating to the outer surface of the display (e.g., greater than 3H pencil). In some cases, the thickness of the top layer may be varied, as well as the material to produce the desired hardness rating.

At 1108, the top layer and the inner layers are laminated together. For example, the top layer and the inner layers may be laminated together using techniques, such as vacuum lamination, roll-to-roll lamination, piece by piece lamentation, etc. For instance, in one example, the top layer and the inner layers may be laminated in a vacuum under a pressure of 50 Pascal (Pa) or less for 20 to 30 seconds. In another instance, the a roll-to-roll lamination process performed at a temperature included in a range of about 15° C. to about 40° C. to combined the layers.

At 1110, a top surface of a bottom layer of the cover component is contacted with a bottom surface of the second inner layer. For example, the bottom layer may be an inorganic material (e.g., glass, sapphire, or ceramic aluminum) selected to provide a stiffness to the display stack or to the overall electronic device. In some cases, the thickness of the bottom layer may be varied, as well as the material to produce the desired stiffness.

At 1112, the bottom layer and top layer and the inner layers are laminated together. For example, the bottom layer and the other layers may be laminated together using techniques, such as vacuum lamination, roll-to-roll lamination, piece by piece lamentation, etc. For instance, in one example, the bottom layer and the other layers may be laminated in a vacuum under a pressure of 50 Pa or less for 20 to 30 seconds. In another instance, the a roll-to-roll lamination process performed at a temperature included in a range of about 15° C. to about 40° C. to combined the layers.

FIG. 1200 illustrates another example flow diagram showing an illustrative process 1200 for forming the composite cover component of the display stack of FIGS. 1-5. For example, a display stack may include a cover component, a front or back light component, a touch component, and a display component. In general, the composite cover component includes a top layer, one or more inner layers, and a bottom layer stacked atop the front or back light component, the touch component, and the display component.

At 1202, a bottom surface of a top layer of the cover component is contacted with a top surface of a first inner layer of the cover component. For example, in some implementations, For example, the first inner layer may be formed from an organic material having a predefined refractive index (e.g., a refractive index in the range of 1.39 to 1.51) and/or formed from a martial having a predefined luminous transmittance (e.g., less than 10% below 400 nm wavelength and greater than 90% over 400 nm wavelength). In other examples, the top layer may be an inorganic material (e.g., glass, sapphire, or ceramic aluminum) selected to provide a desired hardness rating to the outer surface of the display (e.g., greater than 3H pencil). In some cases, the thickness of the top layer may be varied, as well as the material to produce the desired hardness rating.

At 1204, the top layer is laminated with the first inner layer to form a top portion of the cover component. For example, the top layer and the first inner layer may be laminated together using techniques, such as vacuum lamination, roll-to-roll lamination, piece by piece lamentation, etc. For instance, in one example, the top layer and the first inner layer may be laminated in a vacuum under a pressure of 50 Pa or less for 20 to 30 seconds. In another instance, the a roll-to-roll lamination process performed at a temperature included in a range of about 15° C. to about 40° C. to combined the top layer and the first inner layer. In one implementation, the top layer and the first inner layer may be combined by heating the layers at a temperature included in a range of about 25° C. to about 80° C. In another instance, the top layer and the first inner layer are laminated by heating the layers at a temperature included in a range of about 40° C. to about 60° C.

In other implementations, the first inner layer may be an OCA, which may be UV cured to combine the top layer and the first inner layer. For instance, a one or more cycles of UV radiation may be applied to the OCA. In example, multiple cycles of UV radiation (e.g., 2 to 250 seconds of UV expose) may be applied to the OCA. In various implementations, a period of time can elapse between applying cycles of UV radiation to the OCA. In one specific example, the OCA may be applied by a roller process at a pressure included in a range of 50 kPa to 250 kPa.

At 1206, a top surface of a bottom layer of the cover component is contacted with a bottom surface of a second inner layer of the cover component. For example, in some implementations, For example, the second inner layer may be formed from an organic material having a predefined refractive index (e.g., a refractive index in the range of 1.39 to 1.51) and/or formed from a martial having a predefined luminous transmittance (e.g., less than 10% below 400 nm wavelength and greater than 90% over 400 nm wavelength). In another example, the bottom layer may be an inorganic material (e.g., glass, sapphire, or ceramic aluminum) selected to provide a stiffness to the display stack or to the overall electronic device. In some cases, the thickness of the bottom layer may be varied, as well as the material to produce the desired stiffness.

At 1208, the bottom layer is laminated with the second inner layer to form a bottom portion of the cover component. For example, the bottom layer and the second inner layer may be laminated together using techniques, such as vacuum lamination, roll-to-roll lamination, piece by piece lamentation, etc. For instance, in one example, the bottom layer and the second inner layer may be laminated in a vacuum under a pressure of 50 Pa or less for 20 to 30 seconds. In another instance, the a roll-to-roll lamination process performed at a temperature included in a range of about 15° C. to about 40° C. to combined the bottom layer and the second inner layer. In one implementation, the bottom layer and the second inner layer may be combined by heating the layers at a temperature included in a range of about 25° C. to about 80° C. In another instance, the bottom layer and the second inner layer are laminated by heating the layers at a temperature included in a range of about 40° C. to about 60° C.

In other implementations, the second inner layer may be an OCA which may be UV cured to combine the bottom layer and the second inner layer. For instance, a one or more cycles of UV radiation may be applied to the OCA. In example, multiple cycles of UV radiation (e.g., 2 to 250 seconds of UV expose) may be applied to the OCA. In various implementations, a period of time can elapse between applying cycles of UV radiation to the OCA. In one specific example, the OCA may be applied by a roller process at a pressure included in a range of 50 kPa to 250 kPa.

At 1210, a bottom surface of a first inner layer is contacted with a top surface of the second inner layer. In some cases, an additionally inner layer may be located between the first and second inner layers (e.g., an OCA layer) which may be used to combine the top portion and the bottom portion.

At 1212, the top portion and the bottom portion are laminated together to from the cover component having reduced weight. For example, the bottom layer and the other layers may be laminated together using techniques, such as vacuum lamination, roll-to-roll lamination, piece by piece lamentation, etc. For instance, in one example, the bottom layer and the other layers may be laminated in a vacuum under a pressure of 50 Pa or less for 20 to 30 seconds. In another instance, the a roll-to-roll lamination process performed at a temperature included in a range of about 15° C. to about 40° C. to combined the layers.

Figure 13:
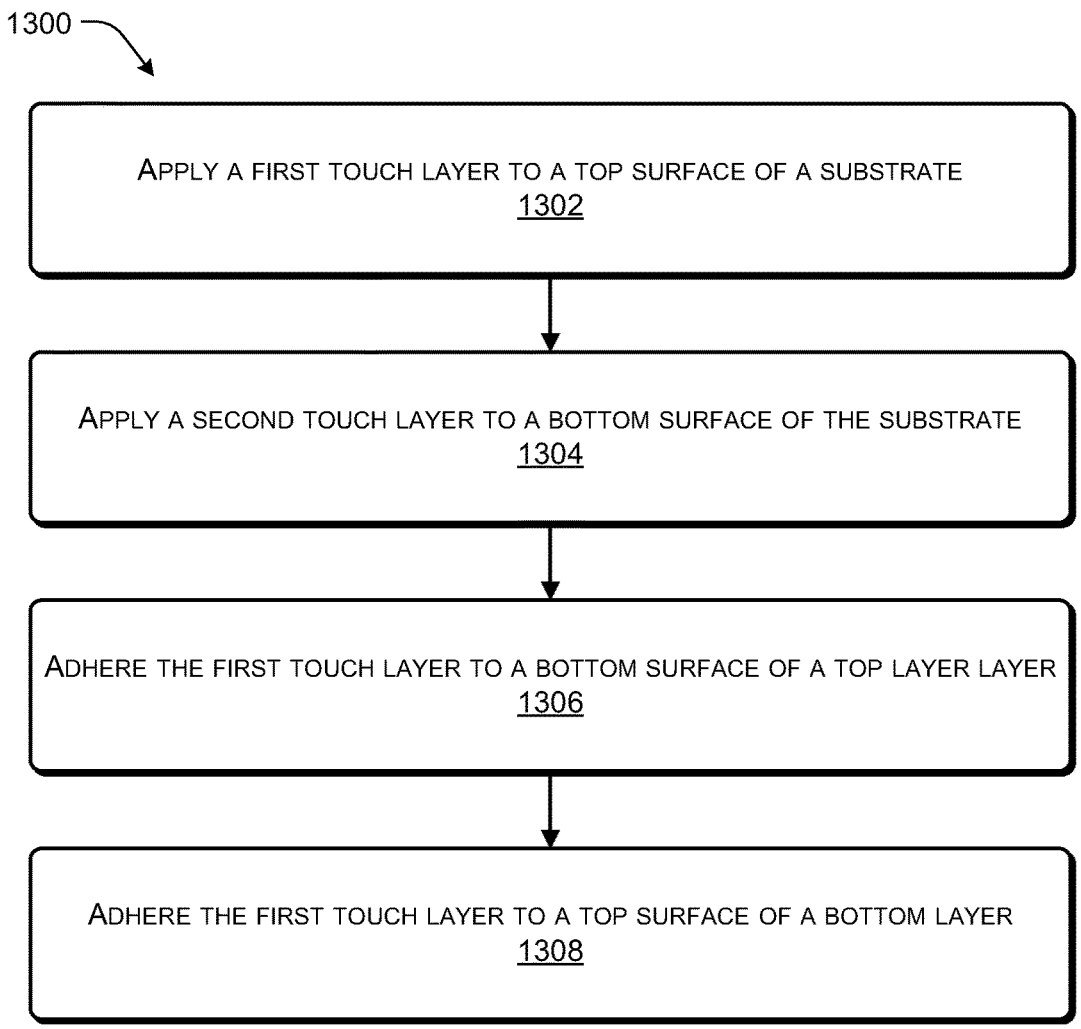
FIG. 13 illustrates an example flow diagram showing an illustrative process for forming the composite cover component of the display stack of FIG. 6.

FIG. 13 illustrates another example flow diagram showing an illustrative process 1300 for forming the composite cover component of the display stack of FIG. 6. For example, a display stack may include a cover component, a front or back light component, a touch component, and a display component. In general, the composite cover component includes one or more touch layers sandwiched between a top and bottom layer.

At 1302, a first touch layer is applied to the top surface of a substrate. For example, the first touch layer or touch pattern may be formed by depositing traces of ITO onto the top surface of the substrate, printing a conductive ink onto the top surface of the substrate, or adhering a pre-formed metal mesh or wiring to the top surface of the substrate. In some specific examples, the first touch layer may be formed by applying ITO to the substrate using physical vapor deposition, electron beam evaporation, or sputter deposition techniques among others. In some examples, the first touch layer may be representative of the vertical electrodes associated with a touch sensing layer. In other examples, the first touch layer may be representative of the horizontal electrodes associated with the touch sensing layer.

At 1304, a second touch layer is applied to the bottom surface of the substrate. For example, the second touch layer or touch pattern may be formed by depositing traces of ITO onto the bottom surface of the substrate, printing a conductive ink onto the bottom surface of the substrate, or adhering a pre-formed metal mesh or wiring to the bottom surface of the substrate. In some specific examples, the second touch layer may be formed by applying ITO to the substrate using physical vapor deposition, electron beam evaporation, or sputter deposition techniques among others. In some examples, the second touch layer may be representative of the vertical electrodes associated with the touch sensing layer. In other examples, the second touch layer may be representative of the horizontal electrodes associated with a touch sensing layer. In one particular example, the first and second touch layers may be a single touch layer applied to a single side of the substrate and including both the horizontal and vertical electrodes of the touch sensing layer.

At 1306, the first touch layer is adhered to a bottom surface of a top layer of the cover component. For example, the first touch layer and the top layer may be laminated together using techniques, such as vacuum lamination, roll-to-roll lamination, piece by piece lamentation, etc. For instance, in one example, the first touch layer and the top layer may be laminated in a vacuum under a pressure of 50 Pascal (Pa) or less for 20 to 30 seconds. In another instance, the a roll-to-roll lamination process performed at a temperature included in a range of about 15° C. to about 40° C. to combined the first touch layer and the top layer. In one implementation, the first touch layer and the top layer may be combined by heating the layers at a temperature included in a range of about 25° C. to about 80° C. In another instance, the first touch layer and the top layer are laminated by heating the layers at a temperature included in a range of about 40° C. to about 60° C.

In other implementations, the first touch layer and the top layer may combined using an OCA that may be UV cured to combine the bottom layer and the second inner layer. For instance, a one or more cycles of UV radiation may be applied to the OCA. In example, multiple cycles of UV radiation (e.g., 2 to 250 seconds of UV expose) may be applied to the OCA. In various implementations, a period of time can elapse between applying cycles of UV radiation to the OCA. In one specific example, the OCA may be applied by a roller process at a pressure included in a range of 50 kPa to 250 kPa.

At 1308, the second touch layer is adhered to a top surface of a bottom layer of the cover component. For example, the second touch layer and the bottom layer may be laminated together in a manner similar to the first touch layer and the top layer, as described above. For instance, the second touch layer and the bottom layer may be laminated together using techniques, such as vacuum lamination, roll-to-roll lamination, piece by piece lamentation, etc., as well as through the use of an OCA.

Figure 14:
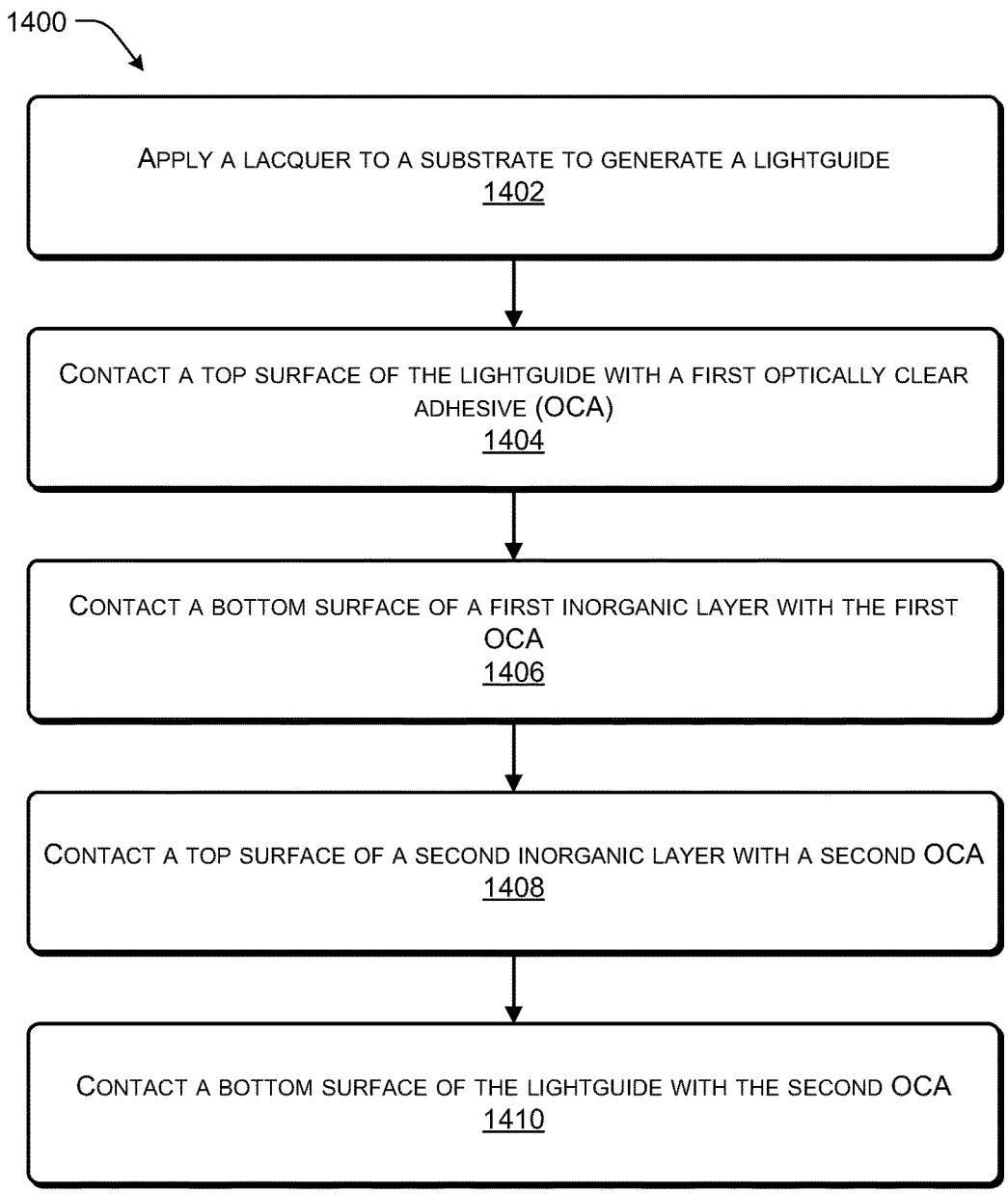
FIG. 14 illustrates another example flow diagram showing an illustrative process for forming the composite cover component of the display stack of FIG. 7.

FIG. 14 illustrates another example flow diagram showing an illustrative process 1400 for forming the composite cover component of the display stack of FIG. 7. For example, a display stack may include a cover component, a front or back light component, a touch component, and a display component. In general, the composite cover component includes a lightguide sandwiched between a top and bottom layer.

At 1402, a lacquer is applied to a substrate to generate a lightguide. For example, the lacquer may be applied to a PMMA plastic substrate, together with multiple grating elements that function to propagate light from the light source towards the top surface of the display stack. In some examples, the grating elements may be configured to stick out or extend outwards into the lacquer to form a positive relief. The lightguide may then be UV-cured or hardened.

At 1404, a top surface of the lightguide is contacted with a first OCA. For example, the top surface of the lightguide may be contacted with an acrylic OCA having a predetermined UV or luminous transmittance rating or with a silicone OCA having a predetermined refractive index.

At 1406, a bottom surface of a first inorganic layer may be contacted with the first OCA. In some implementations, the first inorganic layer may be selected to provide a desired hardness rating to the outer surface of the display (e.g., greater than 3H pencil). In some cases, the thickness of the top layer may be varied, as well as the material to produce the desired hardness rating. In other implementations, the first OCA and may be a SOCA or film that may be die-cut to fit the dimensions associated with the lightguide and the resulting OCA layer may be laminated using an auto glaze process to reduce bubbles that may form during manufacturing. In still other implementations, the first OCA may be a liquid OCA that maybe heated and/or UV cured.

At 1408, a top surface of the second inorganic layer is contacted with a second OCA. For example, the second inorganic layer may be selected to provide stiffness to the display stack or to the overall electronic device. In some cases, the thickness of the bottom layer may be varied, as well as the material to produce the desired stiffness. In some examples, the second OCA may be an acrylic OCA having a predetermined UV or luminous transmittance rating or a silicone OCA having a predetermined refractive index.

At 1410, a bottom surface of the lightguide may be contacted with the second OCA. In some cases, the first OCA and may be a SOCA or film that may be die-cut to fit the dimensions associated with the lightguide and the resulting OCA layer may be laminated using an auto glaze process to reduce bubbles that may form during manufacturing. In still other implementations, the first OCA may be a liquid OCA that maybe heated and/or UV cured.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

What is claimed is:

1. An electronic device comprising;
   a display stack to display content, the display stack including:
   a composite cover having a top layer formed from a transparent inorganic material having a first density, a bottom layer positioned below the top layer and formed from the transparent inorganic material, and at least one inner layer positioned between the top layer and the bottom layer and formed from a transparent organic material having a second density, the second density being less than half of the first density;
   a lightguide to propagate light received from a light source located adjacent to the lightguide;
   a touch layer to detect proximity of an object to the display stack; and
   a display component positioned beneath the touch layer, the lightguide, and the composite cover, the display component to display the content.

2. The electronic device as recited in claim 1, wherein:
   the transparent inorganic material includes at least one of glass, sapphire, or ceramic aluminum; and
   the transparent organic material includes at least one of polyurethane, polymethylmethacrylate (PMMA), polycarbonate (PC), polyethylene terephthalate (PT), silicone, cycloolefin polymer (COP), cycloolefin copolymer (COC), or a combination thereof.

3. The electronic device as recited in claim 1, wherein the touch layer is incorporated into the at least one inner layer of the composite cover.

4. The electronic device as recited in claim 1, wherein the lightguide is incorporated into the at least one inner layer of the composite cover.

5. A display stack comprising:
   a laminate cover including:
   a top layer formed from a transparent inorganic material having a first density;
   one or more inner layers formed from a transparent organic material having a second density, the second density being less than the first density; and
   a bottom layer formed from the transparent inorganic material,
   wherein the one or more inner layers are disposed between the top layer and the bottom layer.

6. The display stack as recited in claim 5, wherein at least one of the one or more inner layers of the laminate cover includes a touch layer.

7. The display stack as recited in claim 5, wherein at least one of the one or more inner layers of the laminate cover includes a lightguide.

8. The display stack as recited in claim 5, wherein the laminate cover is less than one millimeter thick.

9. The display stack as recited in claim 5, wherein the second density is less than 80% of the first density.

10. The display stack as recited in claim 5, wherein the second density is less than 50% of the first density.

11. The display stack as recited in claim 5, wherein the transparent inorganic material has a hardness rating of at least 3H pencil based on a pencil hardness test system.

12. The display stack as recited in claim 5, wherein:
the transparent inorganic material includes at least one of glass, sapphire, or ceramic aluminum; and
the transparent organic material includes at least one of polyurethane, polymethylmethacrylate (PMMA), polycarbonate (PC), polyethylene terephthalate (PT), silicone, cycloolefin polymer (COP), cycloolefin copolymer (COC), or a combination thereof.

13. A method comprising:
providing a top layer of a composite cover formed from a transparent inorganic material having a first density;
providing an inner layer of the composite cover, the inner layer formed from a transparent organic material having a second density, the second density less than the first density;
contacting a bottom surface of the top layer with a top surface of the inner layer;
providing a bottom layer of the composite cover; and
contacting a top surface of the bottom layer with a bottom surface of the inner layer.

14. The method as recited in claim 13, further comprising providing a touch sensing layer within the inner layer.

15. The method as recited in claim 13, further comprising providing a lightguide within the inner layer.

16. The method as recited in claim 13, wherein the second density is less than 80% of the first density.

17. The method as recited in claim 13, wherein the second density is less than 50% of the first density.

18. The method as recited in claim 13, wherein the bottom layer is formed from the transparent inorganic material.

19. The method as recited in claim 13, wherein the bottom layer is formed from the transparent organic material.

20. The method as recited in claim 13, wherein a combined thickness of the top layer, the inner layer, and the bottom layer is 1 mm or less.

* * * * *